US006815315B2

(12) United States Patent
Watabe et al.

(10) Patent No.: US 6,815,315 B2
(45) Date of Patent: Nov. 9, 2004

(54) METHOD FOR ELECTROCHEMICAL OXIDATION

(75) Inventors: Yoshifumi Watabe, Tondabayashi (JP); Koichi Aizawa, Neyagawa (JP); Takuya Komoda, Sanda (JP); Takashi Hatai, Neyagawa (JP); Yoshiaki Honda, Souraku-gun (JP)

(73) Assignee: Matsushita Electric Works, Ltd., Osaka (JP)

( * ) Notice: Subject to any disclaimer, the term of this patent is extended or adjusted under 35 U.S.C. 154(b) by 0 days.

(21) Appl. No.: 10/482,172

(22) PCT Filed: May 14, 2003

(86) PCT No.: PCT/JP03/05976

§ 371 (c)(1),
(2), (4) Date: Jan. 8, 2004

(87) PCT Pub. No.: WO03/096401

PCT Pub. Date: Nov. 20, 2003

(65) Prior Publication Data

US 2004/0180516 A1 Sep. 16, 2004

(30) Foreign Application Priority Data

May 14, 2002 (JP) ........................................ 2002-138993

(51) Int. Cl.[7] .............................................. H01L 21/00
(52) U.S. Cl. ........................... 438/466; 438/10; 438/770
(58) Field of Search .......................... 438/466, 10, 770

(56) References Cited

U.S. PATENT DOCUMENTS

| | | | | |
|---|---|---|---|---|
| 3,725,161 | A | * | 4/1973 | Kuper ........................ 438/478 |
| 6,143,627 | A | * | 11/2000 | Robinson .................... 438/441 |
| 6,285,118 | B1 | | 9/2001 | Hatai et al. |
| 6,498,426 | B1 | | 12/2002 | Watabe et al. |
| 6,559,069 | B2 | * | 5/2003 | Goldbach et al. ........... 438/770 |
| 6,583,578 | B1 | | 6/2003 | Ichihara et al. |
| 2003/0013215 | A1 | | 1/2003 | Komoda et al. |
| 2003/0102793 | A1 | | 6/2003 | Komoda et al. |

FOREIGN PATENT DOCUMENTS

| | | |
|---|---|---|
| EP | 1003195 | 5/2000 |
| JP | 58-154237 | 9/1983 |
| JP | 62-299036 | 12/1987 |
| JP | 2001-23948 | 1/2001 |
| JP | 2001-155622 | 6/2001 |
| JP | 2002-8527 | 1/2002 |
| JP | 2003-203563 | 7/2003 |

OTHER PUBLICATIONS

M. Kato, "Yokyoku Sankaho ni Youru 6H–3SiC no Gisei Sanka to Schottky Barrier Diode Yokusei," Gijutsu Kenkyu Hokoku, vol. 101, No. 81, May 25, 2001, pp. 13–18, together with an English language Abstract.
English Language Abstract of JP 58–154237.
English Language Abstract of JP 2002–8527.
English Language Abstract of JP 2003–203563.
English Language Abstract of JP 2001–23948.
English Language Abstract of JP 62–299036.
English Language Abstract of JP 2001–155622.

* cited by examiner

Primary Examiner—Alexander Ghyka
(74) Attorney, Agent, or Firm—Greenblum & Bernstein, P.L.C.

(57) ABSTRACT

Disclosed is a method for the electrochemical oxidation of a semiconductor layer. In an electrochemical oxidation treatment for the production process of an electron source 10 (field-emission type electron source) as one of electronic devices, a control section 37 determines a voltage increment due to the resistance of an electrolytic solution B in advance, based on a detected voltage from a resistance detect section 35. Then, the control section 37 controls a current source to supply a constant current so as to initiate an oxidation treatment for a semiconductor layer formed on an object 30. The control section 37 corrects a detected voltage from a voltage detect section 36 by subtracting the voltage increment therefrom. When the corrected voltage reaches a given upper voltage value, the control section 37 is operable to discontinue the output of the current source 32 and terminate the oxidation treatment. The present invention allows electronic devices to be produced with reduced variation in the characteristics thereof.

16 Claims, 19 Drawing Sheets

METHOD FOR ELECTROCHEMICAL OXIDATION

TECHNICAL FIELD

The present invention relates to a method for the electrochemical oxidation of semiconductors.

BACKGROUND ART

There has heretofore been known a wet anodization method as one of techniques for providing porosity to a semiconductor or for forming an oxide film on the surface of a semiconductor. The techniques for forming an oxide film on the surface of a semiconductor also include an electrochemical oxidation method utilizing an electrochemical reaction. In late years, there has been proposed a field emission-type electron source prepared by a process using a wet anodization method and an electrochemical oxidation method.

For example, as shown in FIG. 20, this kind of field emission-type electron source 10 (hereinafter referred to as "electron source 10" for brevity) comprises an n-type silicon substrate 1 as a conductive substrate, and a strong-field drift layer 6 (hereinafter referred to as "drift layer 6" for brevity) which is composed of an oxidized porous polycrystalline silicon layer and formed on the side of one of the principal surfaces of the n-type silicon substrate 1. Further, a surface electrode 7 composed of a metal thin film (e.g. gold thin film) is formed on the drift layer 6, and an ohmic electrode 2 is formed on the back surface of the n-type silicon substrate 1. In this structure, the n-type silicon substrate 1 and the ohmic electrode 2 serve as a lower electrode 12. While the electron source 10 illustrated in FIG. 20 includes a non-doped polycrystalline silicon layer 3 interposed between the n-type silicon substrate 1 and the drift layer 6, there has also been proposed another electron source designed such that the drift layer 6 is formed directly on the principal surface of the n-type silicon substrate 1.

In an operation of emitting electrons from the electron source 10 illustrated in FIG. 20, a collector electrode 21 is disposed in opposed relation to the surface electrode 7. Then, after a vacuum is formed in the space between the surface electrode 7 and the collector electrode 21, a DC voltage Vps is applied between the surface electrode 7 and the lower electrode 12 in such a manner that the surface electrode 7 has a higher potential than that of the lower electrode 12. Simultaneously, a DC voltage Vc is applied between the collector electrode 21 and the surface electrode 7 in such a manner that the collector electrode 21 has a higher potential than that of the surface electrode 7. Each of the DC voltages Vps, Vc can be appropriately arranged to allow electrons injected from the lower electrode 12 into the drift layer 6 to be emitted through the surface electrode 7 after drifting in the drift layer 6 (the one-dot chain lines in FIG. 20 indicate the flow of the electrons e⁻ emitted through the surface electrode 7.). The surface electrode 7 is made of a metal material having a small work function.

While the electron source 10 illustrated in FIG. 20 has the lower electrode 12 composed of the n-type silicon substrate 1 and the ohmic electrode 2, there has also been proposed another electron source 10 as shown in FIG. 21, in which a lower electrode 12 made of a metal material is formed on one of the principal surfaces of an insulative substrate 11. The electron source 10 illustrated in FIG. 21 emits electrons in the same process as that of the electron source 10 illustrated in FIG. 20.

Generally, in this kind of electron source 10, a current flowing between the surface electrode 7 and the lower electrode 12 is referred to as "diode current Ips", and a current flowing between the collector electrode 21 and the surface electrode 7 is referred to as "emission current (emitted electron current) Ie". In the electron sources 10, an electrode emission efficiency (=(Ie/Ips)×100[%]) becomes higher as the ratio (Ie/Ips) of the emission current Ie to the diode current Ie is increased. In this connection, the emission current Ie becomes higher as the DC voltage Vps is increased. This electron source 10 exhibits electron emission characteristics having a low dependence on the degree of vacuum, and can stably emit electrons at a high electron emission efficiency without occurrence of a so-called popping phenomenon.

If the electron source 10 illustrated in FIG. 21 is applied as an electron source of a display, the display may be configured as shown in FIG. 22. The display illustrated in FIG. 22 comprises an electron source 10, and a faceplate 30 which is composed of a flat-plate-shaped glass substrate and disposed in opposed relation to the electron source 10. A collector electrode (hereinafter referred to as "anode electrode") 21 composed of a transparent conductive film (e.g. ITO film) is formed on the surface of the faceplate 30 opposed to the electron source 10. The surface of the anode electrode 21 opposed to the electron source 10 is provided with fluorescent materials formed in each of pixels, and black stripes made of a black material and formed between the fluorescent materials. Each of the fluorescent materials applied on the surface of the anode electrode 21 opposed to the electron source 10 can generate a visible light in response to electron beams emitted from the electron source 10. The electrons emitted from the electron source 10 are accelerated by a voltage applied to the anode electrode 21, and the highly energized electrons come into collision with the fluorescent materials. Three type of fluorescent materials having luminescent colors of R (red), G (green) and B (blue) are used as the fluorescent materials. The faceplate 30 is spaced apart from the electron source 10 by a rectangular frame (not shown), and an sealed space formed between the faceplate 30 and the electron source 10 is kept in vacuum.

The electron source 10 illustrated in FIG. 22 comprises an insulative substrate 11 composed of a glass substrate, a plurality of lower electrodes 12 arranged in lines on the surface of the insulative substrate 11, a plurality of polycrystalline silicon layers 3 each of which is formed on the corresponding lower electrode 12 in a superimposed manner, a plurality of drift layers 6 each of which is composed of an oxidized porous polycrystalline silicon layer and formed on the corresponding polycrystalline silicon layer 3 in a superimposed manner, a plurality of isolation layers 16 each of which is composed of a polycrystalline silicon layer and embedded between the adjacent drift layers 6, and a plurality of surface electrodes 7 which are formed on the drift layers 6 and the isolation layers 16, and arranged in lines to extend in the crosswise direction of the lower electrodes 12 so as to cut across the drift layers 6 and the isolation layers 16.

In the electron source 10, the drift layers 6 are partly sandwiched between the corresponding lower electrodes 12 arranged on the surface of the insulative substrate 11 and the corresponding surface electrodes 7 arranged in the crosswise direction of the lower electrodes 12, at the regions of the drift layers 6 corresponding to the intersecting points between the corresponding lower electrodes 12 and the corresponding surface electrodes 7. Thus, a certain voltage can be applied between appropriately selected one of the plural pairs of the surface electrode 7 and the lower electrode 12, to allow a strong electric field to act on the region of the drift layer 6 corresponding to the intersecting point between the selected surface electrode 7 and lower electrode 12 so as to emit electrons from the region. This configuration is equivalent to an electron source in which a plurality of electron source elements 10a, each of which comprises the lower electrode 12, the polycrystalline silicon layer 3 on the lower electrode 12, the drift layer 6 on the polycrystalline layer 3, and the surface electrode 7 on the drift layer 6, are arranged, respectively, at the lattice points of a matrix (lattice) formed by a group of the surface electrodes 7 and a group of the lower electrodes 12a. One of the pairs of the surface electrode 7 and the lower electrode 12 to be applied with a certain voltage, can be selected to allow electrons to be emitted from desired one of the electron source elements 10a.

In a conventional production process for the electron source 10, the drift layer 6 is formed through a film-forming step of forming a non-doped polycrystalline silicon layer on the side of one of the surfaces of the lower electrode 12, an anodization step of anodizing the polycrystailine silicon layer to form a porous polycrystalline silicon layer containing polycrystal line silicon grains and nanometer-order silicon microcrystals, and an oxidation step of rapidly heating and oxidizing the porous polycrystalline silicon layer through a rapid heating method to form silicon oxide films on the surfaces of the grains and the nanometer-order silicon microcrystals, respectively.

In the anodization step, a mixture prepared by mixing an aqueous solution of hydrogen fluoride with ethanol at the ratio of about 1:1 is used as an electrolytic solution. In the oxidation step, a substrate is oxidized by increasing the substrate from room temperature up to 900° C. in a short period of time under a dry oxygen atmosphere, and maintaining the substrate temperature at 900° C. for 1 hour, for example, using a lamp annealing apparatus. Then, the substrate temperature is reduced down to room temperature.

For example, a conventional anodization apparatus as shown in FIG. 24A is used in the anodization step. This anodization apparatus comprises a processing both 31 containing a electrolytic solution A consisting a mixture of ethanol and an aqueous solution of hydrogen fluoride, and a cathode 33 composed of a grid-like platinum electrode and immersed into the electrolytic solution A in the processing bath 31. An object 30 having a polycrystalline silicon layer formed on the lower electrode 12 is immersed into the electrolytic solution A, and the lower electrode 12 is used as an anode. This anodization apparatus includes a current source 32 for supplying a current between the lower electrode 12 serving as an anode and the cathode 33 in such a manner that the anode has a higher potential than that of the cathode. The anodization apparatus also includes a light source (not shown) composed of a tungsten lamp for irradiating the principal surface of the object 30 (or the front surface of the polycrystalline silicon layer) with light.

A constant current is supplied between the anode and the cathode 33 through an anodization method using the above anodization apparatus to provide porosity from the surface of a target region E in the polycrystalline silicon layer toward the depth direction thereof, so as to form a porous polycrystalline silicon layer containing polycrystalline silicon grains and nanometer-order silicon microcrystals in the target region.

As shown in FIG. 25, the electron source 10 illustrated in FIG. 22 may be produced by arranging a plurality of lower electrodes 12 in lines on the side of one of the principal surfaces of an insulative substrate 11, forming a polycrystalline silicon layer 3 on the side of the above principal surface of the insulative substrate 11, and anodizing the respective regions of the polycrystalline silicon layer 3 superimposed on the lower electrodes 12. In this process, a certain current is supplied to the lower electrode 12 through a current-feeding wiring 12a continuously extending in integral with the lower electrode 12.

In the oxidation step, the porous polycrystalline silicon layer is rapidly heated and oxidized through the rapid heating method, as described above. Differently from this method, a technique using an electrochemical oxidation method of electrochemically oxidizing the porous polycrystalline silicon layer within an electrolytic solution (electrolyte solution) consisting of an aqueous solution of sulfuric acid, nitric acid or the like, in the oxidation step is proposed to form a silicon oxide film having an excellent film quality on all of the surfaces of the silicon microcrystals and the grains. More specifically, in the drift layer 6, when the porous polycrystalline silicon layer is oxidized, a thin silicon oxide layer would be formed on each of the surfaces of a number of silicon microcrystals and a number of grains contained in the porous polycrystalline silicon layer. In view of this point, the proposed electrochemical oxidation method is intended to form a silicon oxide film having an excellent film quality on all of the surfaces of the silicon microcrystals and the grains, by electrochemically oxidizing the porous polycrystalline silicon layer within an electrolytic solution consisting, for example, of 1 mol/l of aqueous solution of sulfuric acid, nitric acid or the like, in the step of forming the drift layer 6.

The porous polycrystalline is electrochemically oxidized using an electrochemical oxidation apparatus of FIGS. 23A and 23B, in which the electrolytic solution A in the anodization apparatus of FIGS. 24A and 24B is replaced with an electrolytic solution B consisting, for example, of an aqueous solution of sulfuric acid. As shown in FIG. 23B, a cathode is set to have the same outside dimension as that of the target region E of the polycrystalline silicon layer. With this electrochemical oxidation apparatus, a certain current can be supplied from a current source 32 between the anode and the cathode 33 so as to electrochemically oxidize the polycrystalline silicon layer in the target region E to form a silicon oxide films on each of the surfaces of the silicon microcrystals and the grains.

In the step of forming the porous polycrystalline silicon layer, the anodization treatment is completed after a certain current is supplied between the anode and the cathode 33 just for a predetermined period of time. By contrast, in the step of electrochemically oxidizing the porous polycrystalline silicon layer, a certain current is supplied between the anode and the cathode 33, and the current supply is terminated at the time when the voltage between the anode and the cathode 33 is increased up to a predetermined value arranged depending on the characteristics (e.g. emission current or withstand voltage) of the electron source 10 (see, for example, Japanese Patent Laid-Open Publication No. 2001-155622)

As compared to the method of rapidly heating and oxidizing the porous polycrystalline silicon layer to form the drift layer 6, the electrochemical oxidation method allows the porous polycrystalline silicon layer to be oxidized under a lowered process temperature. Thus, the restrictions on the material of the substrate can be reduced to facilitate increase in the area and reduction in the cost of the electron source 10.

On the other hand, the conventional electron source 10 produced using the aforementioned electrochemical oxidation method involves a problem of increased variation of the emission current Ie and/or withstand voltage in the surface thereof, and resultingly deteriorated process yield. That is, an electronic device produced using the aforementioned electrochemical oxidation method has a problem of wide variation in their characteristics, such as emission current or withstand voltage.

The characteristics, such as emission current or withstand voltage, would be widely varied due to the following factors:

1) In the aforementioned electrochemical oxidation method, a voltage increment due to the resistance of the electrolytic solution B is included in the voltage between the anode and the cathode. Thus, a voltage incitement due to the formation of the oxide films will be varied according to the variation in the voltage increment caused by the variation in the resistance of the electrolytic solution B.

2) As shown in FIG. 23B, the cathode 33 is set to have the same outside dimension as that of the target region. Thus, a current flows through the electrolytic solution B by paths as shown by the arrows in FIG. 23A, and the peripheral portion of the target region E has a higher current density than that in the remaining region thereof.

3) During electrochemical oxidation, air bubbles are formed on the principal surfaces of the porous polycrystalline silicon layer which is a semiconductor layer to suppress the reaction in the region having the air bubbles formed thereon.

The factor 1) leads to increased variation in the characteristics, such as emission current or withstand voltage, mainly in each of processing batches. The factor 2) or 3) leads to increased in-plane variation in the characteristics, such as emission current or withstand voltage, mainly in a sample, and deteriorated process yield of electronic devices.

DISCLOSURE OF INVENTION

In view the above problems, it is therefore an object of the present invention to provide an electrochemical oxidation method capable of reducing the variation in characteristics, such as emission current or withstand voltage, as compared to conventional methods.

In order to achieve the above object, the present invention provides a method for the electrochemical oxidation of a semiconductor layer, wherein an electrode provided on the opposite side of the principal surface of the semiconductor layer is used as an anode, and a current is supplied between the anode and a cathode while allowing the semiconductor layer and the cathode to be in contact with an electrolytic solution, to oxidize the semiconductor layer. In this electrochemical oxidation method, a current is first supplied between the anode and the cathode to initiate the oxidation. Then, the oxidation is terminating under the condition that a corrected voltage value Vt determined by correcting a voltage V between the anode and the cathode in accordance with a voltage inclement V0 based on a pre-detected resistance of the electrolytic solution is equal to a predetermined upper voltage value V1.

According to the above electrochemical oxidation method, the variation in the increment of the voltage between the anode and the cathode in the period between the initiation and termination of the oxidation can be reduced irrespective of the resistance of the electrolytic solution. Thus, the variation of the voltage increment caused by the formation of the oxide films can be reduced to allow the characteristics of an electronic device to have desirably suppressed variation.

In the electrochemical oxidation method, a current density in the principal surface of the semiconductor layer may be controlled in such a manner that the current density in the periphery of the oxidation target region of the semiconductor layer is restrained in increasing to be greater than the remaining oxidation target region. In this case, the in-plane variation of the current density in the oxidation target region can be reduced as compared to the conventional methods to allow the characteristics of an electronic device to have desirably suppressed in-plane variation.

Further, air bubbles formed on the principal surface of the semiconductor layer during the supply of the current may be released from the principal surface while supplying the current. In this case, the oxidation target region can avoid the deterioration in a required reaction therein due to air bubbles to allow the characteristics of an electronic device to have desirably suppressed in-plane variation.

BRIEF DESCRIPTION OF DRAWINGS

The present invention will be more sufficiently understood from the detailed description and the accompanying drawings. In the accompanying drawings, common components or elements are defined by the same reference numerals or codes.

BEST MODE FOR CARRYING OUT THE INVENTION

Figure 1:
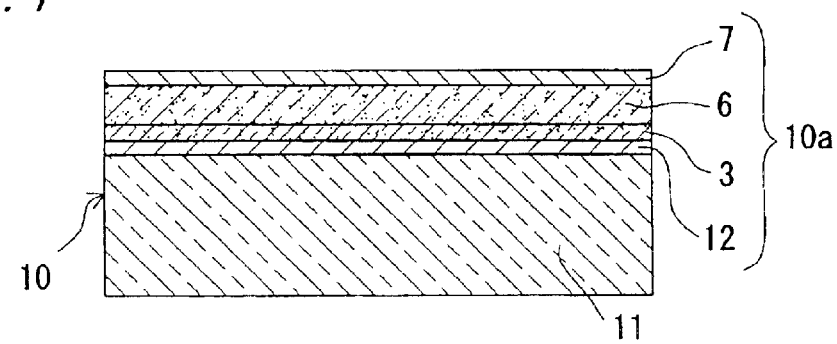
FIG. 1 is a schematic vertical sectional view of an electron source (field-emission-type electron source) concerning a first mode of embodiment.

This application is based upon and claims the benefit of priority from the prior Japanese Patent Application No. 2002-138993, the entire contents of which are incorporated herein by reference.

Several modes of embodiment of the present invention will now be specifically described. Members common in each mode of embodiment or members having substantially the same structure and function are defined by the same reference numerals, and duplicate descriptions will be omitted.

[First Mode of Embodiment]

A first mode of embodiment will be described by taking an electron source (field-emission-type electron source) for example, as one of electronic devices produced using an electrochemical oxidation method of the present invention.

As shown in FIG. 1A, the electron source 10 concerning the first mode of embodiment comprises an electron source element 10a formed on the side of one of the principal surfaces of a substrate 11 composed of an insulative substrate (e.g. a glass substrate having an insulation performance or a ceramic substrate having an insulation performance). The electron source element 10a includes a lower electrode 12 formed on the side of the above principal surface of the substrate 11, a non-doped polycrystalline silicon layer 3 formed on the lower electrode 12, a drift layer 6 (strong-field drift layer) formed on the polycrystalline silicon layer 3, and a surface electrode 7 formed on the drift layer 6. That is, in the electron source element 10a, the surface electrode 7 is dispose in opposed relation to the lower electrode 12, and the drift layer 6 is interposed between the surface electrode 7 and the lower electrode 12. While an insulative substrate is used as the substrate 11 in the first mode of embodiment, a semiconductor substrate such as a silicon substrate may be used as the substrate. In this case, the lower electrode may comprise the semiconductor substrate, and a conductive layer (e.g. ohmic electrode) laminated on the back surface of the semiconductor layer. Further, while the polycrystalline silicon layer 3 is interposed between the drift layer 6 and the lower electrode 12, the drift layer 6 may be formed directly on the lower electrode 12.

The lower electrode 12 is formed of a single-layer thin film made of metal material (e.g. Mo, Cr, W, Ti, Ta, Ni, Al, Cu, Au or Pt; alloy thereof; or intermetallic compound such as silicide). The lower electrode 12 may also be formed of a multilayer thin film made of the above metal materials. The thickness of the lower electrode 12 is set at about 300 nm.

While the surface electrode 7 is made of a material having a small function, for example gold, the material of the surface electrode 7 is not limited to gold. The surface electrode is not limited to a single-layer structure, but may be formed as a multilayer structure. The surface electrode 7 may be set at any thickness allowing electrons from the drift layer 6 to tunnel therethrough, for example, in the range of about 10 to 15 nm.

Figure 2:
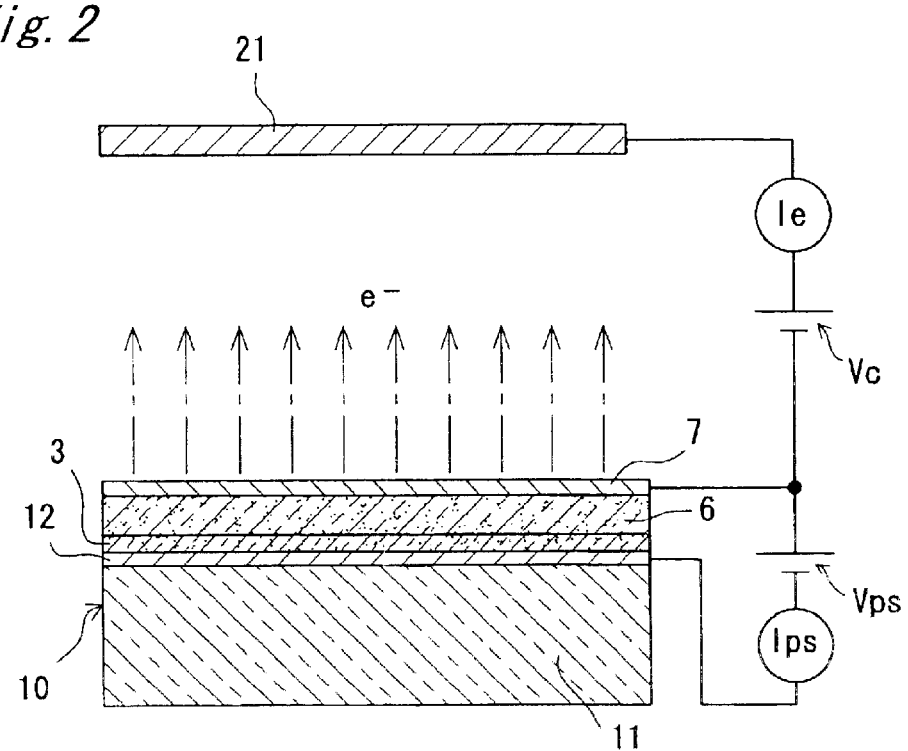
FIG. 2 is an explanatory diagram showing the operation of the electron source in FIG. 1.

As shown in FIG. 2, in an operation of emitting electrons from the electron source 10, a collector electrode 21 is disposed in opposed relation to the surface electrode 7. Then, after a vacuum is formed in the space between the surface electrode 7 and the collector electrode 21, a DC voltage Vps is applied between the surface electrode 7 and the lower electrode 12 in such a manner that the surface electrode 7 has a higher potential than that of the lower electrode 12. Simultaneously, a DC voltage Vc is applied between the collector electrode 21 and the surface electrode 7 in such a manner that the collector electrode 21 has a higher potential than that of the surface electrode 7. Each of the DC voltages Vps, Vc can be appropriately arranged to allow electrons injected from the lower electrode 12 into the drift layer 6 to be emitted through the surface electrode 7 after drifting in the drift layer 6 (the one-dot chain lines in FIG. 2 indicate the flow of the electrons e⁻ emitted through the surface electrode 7.). Since electrons reaching the surface of the drift layer 6 would be hot electrons, they can readily tunnel through the surface electrode 7 and burst out into a vacuum space. In this electron sources 10, an electrode emission efficiency (=(Ie/Ips)×100[%]) becomes higher as the ratio (Ie/Ips) of an emission current Ie to a diode current Ie is increased.

Figure 3:
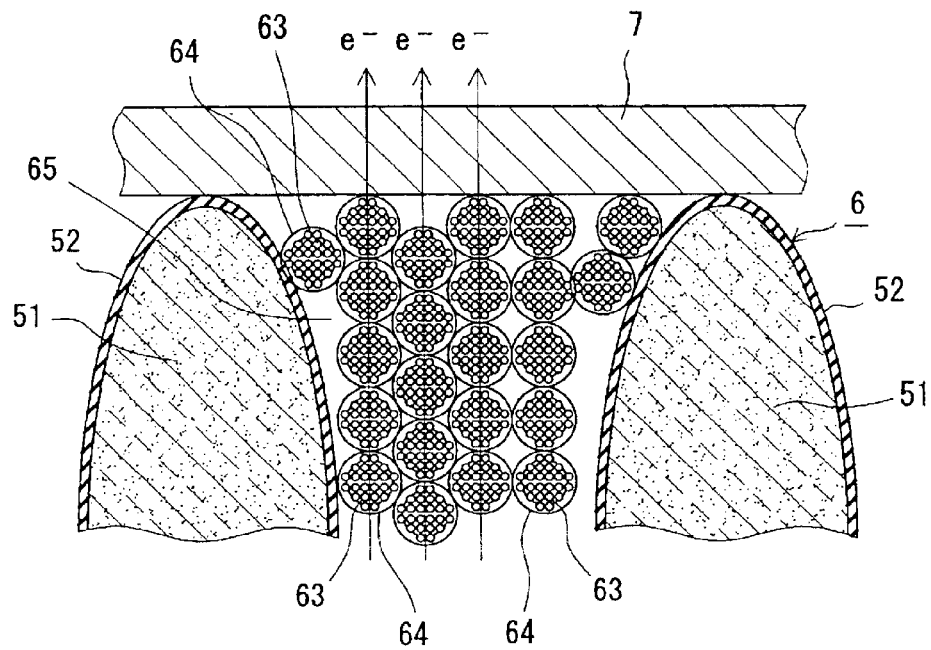
FIG. 3 is a schematic fragmentary enlarged vertical sectional view showing the electron source in FIG. 1.

As shown in FIG. 3, the drift layer 6 is formed through a nanocrystallization process using an anodization method and an oxidation process using an electrochemical oxidation method, as described later. It is believed that the drift layer 6 comprise at least a plurality of columnar polycrystalline silicon grains (semiconductor crystals) 51 arrayed in lines on the side of the above principal surface of the lower electrode 12, a plurality of thin silicon oxide films 52 each formed over the surface of the corresponding grain 51, a number of nanometer-order silicon microcrystals (semiconductor microcrystal) 63 residing between the adjacent grains 51, and a number of silicon oxide films (insulative films) 64 each formed over the surface of the corresponding silicon microcrystal 63. Each of the silicon oxide films has a film thickness less than the grain size of the corresponding silicon microcrystal 63. Each of the grains 51 extends in the thickness direction of the lower electrode 12.

In the electron source 10, the electron emission would be caused based on the following mode. A DC voltage Vps is applied between the surface electrode 7 and the lower electrode 12 in such a manner that the surface electrode 7 has a higher potential than that of the lower electrode 112, and simultaneously a DC voltage Vc is applied between the collector electrode 21 and the surface electrode 7 in such a manner that the collector electrode 21 has a higher potential than that of the surface electrode 7. When the DC voltage Vps reaches a given value (critical value), electrons e⁻ are injected from the lower electrode 12 into the drift layer 6. At the same time, the electric field applied to the drift layer 6 mostly acts to the silicon oxide films 64. Thus, the electrons e⁻ injected into the drift layer 6 are accelerated by the strong electric field acting on the silicon oxide films 64. In the drift layer 6, the electrons then drift toward the surface electrode or in the direction of the arrows in FIG. 3, through the region between the adjacent grains 51. After tunneling through the surface electrode 7, the electrons are emitted to the vacuum space. In this manner, the electrons injected from the lower electrode 12 into the drift layer 6 are accelerated by the electric field acting on the silicon oxide films 64, and then emitted through the surface electrode 7 after drifting approximately without scattering due to the silicon microcrystals 63. Further, heat generated at the drift layer 6 is released through the grains 51. Thus, during the electron emission, the electrons can be stably emitted without occurrence of the popping phenomenon.

Figure 4A:
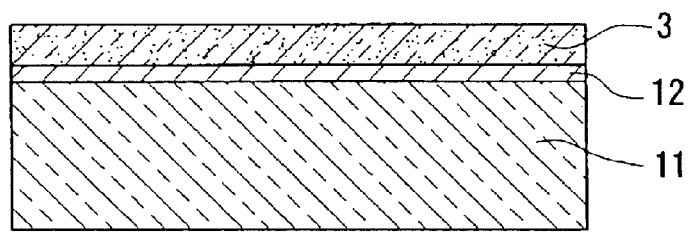
FIGS. 4A to 4D are schematic vertical sectional views of the electron source in FIG. 1 and intermediate products in major steps of a production process thereof, wherein a production method of the electron source is explained in conjunction therewith.

In a production process of this electron source 10, a lower electrode 12 composed of a metal film (e.g. tungsten film) having a given film thickness (e.g. about 300 nm) is first formed on one of the principal surfaces of a substrate 11 composed of a glass substrate having an insulation performance. Then, a non-doped polycrystalline silicon layer 3 having a given film thickness (e.g. 1.5 μm) is formed on the entire principal surface of the substrate 11, for example, through a plasma CVD method, to obtain a structure (intermediate product) as shown in FIG. 4A. The film-forming method for the polycrystalline silicon layer 3 is not limited to the plasma CVD method, but any other suitable film-forming method, such as a LPCVD method, a catalytic-CVD method, a sputtering method or a CGS (Continuous Grain Silicon) method, may be used.

Figure 4B:
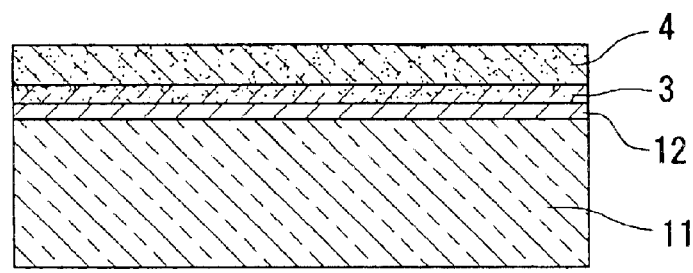
Figure 24A:
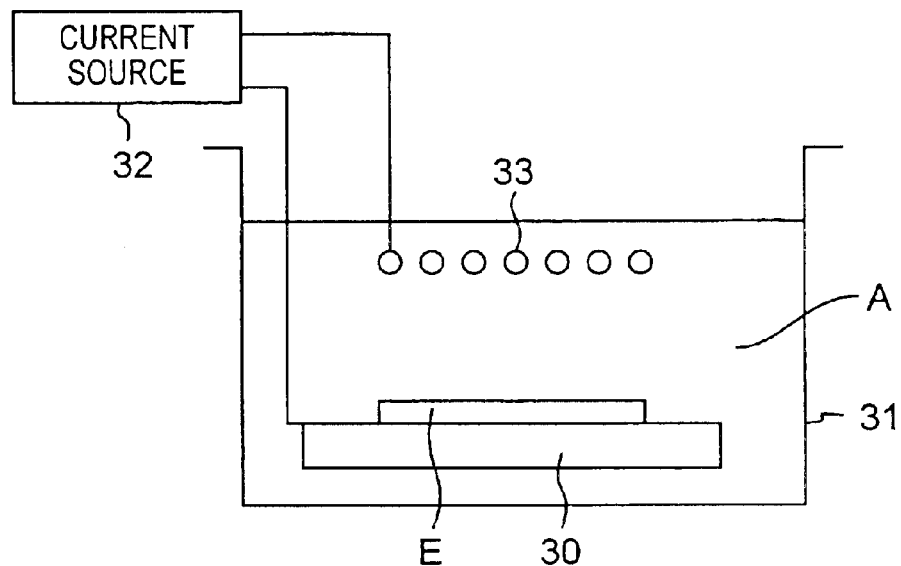
FIG. 24A is a schematic front view of an anodization apparatus.
Figure 24B:
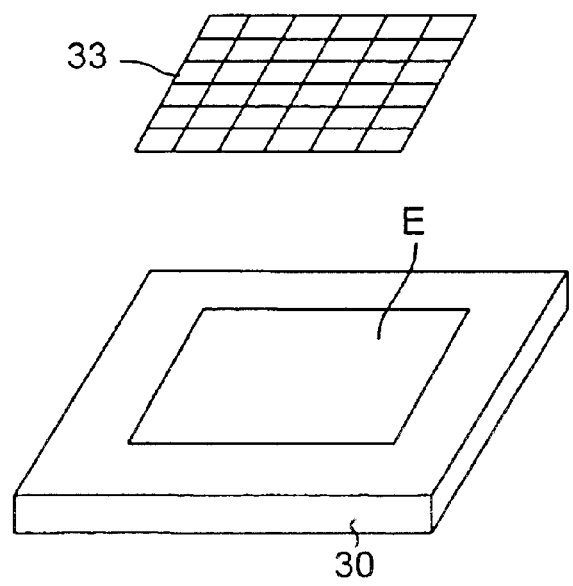
FIG. 24B is a schematic perspective view of the anodization apparatus in FIG. 24A.
Figure 25:
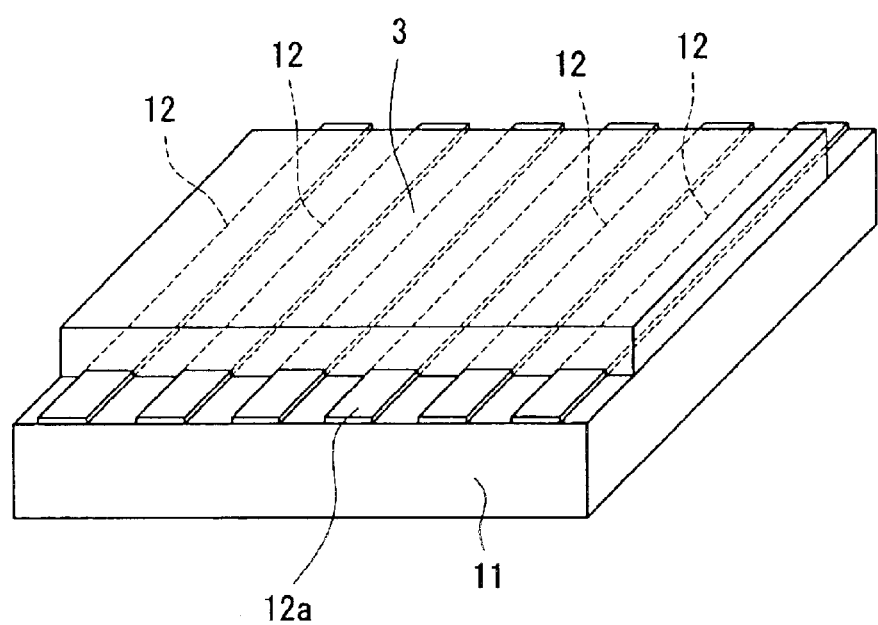
FIG. 25 is a perspective view of an intermediate product in a major step of a production process of a display using a conventional electron source.

After the formation of the non-doped polycrystalline silicon layer 3, the nanocrystallization process is performed to form a composite nanocrystal layer 4 including a number of polycrystalline silicon grains 51 (see FIG. 3) and a number of silicon microcrystals 63 (see FIG. 3) which are mixed together. In this manner, a structure as shown in FIG. 4B is obtained. The nanocrystallization process is performed using an anodization apparatus as shown in FIGS. 24A and 24B. The anodization apparatus comprises a processing bath containing an electrolytic solution A formed as a mixture of an aqueous solution of 55 wt % hydrogen fluoride and ethanol which are mixed at the ratio of about 1:1. A given current (e.g. a current having a current density of 12 mA/cm²) is supplied between a platinum electrode serving as a cathode and the lower electrode 12 serving as an anode, for a given time (e.g., 10 seconds) while irradiating the polycrystalline silicon layer 3 with light to form the composite nanocrystal layer 4. This composite nanocrystal layer 4 includes the polycrystalline silicon grains 51 and the silicon microcrystals 63. In the first mode of embodiment, the composite nanocrystal layer 4 serves as a semiconductor layer.

Figure 4C:
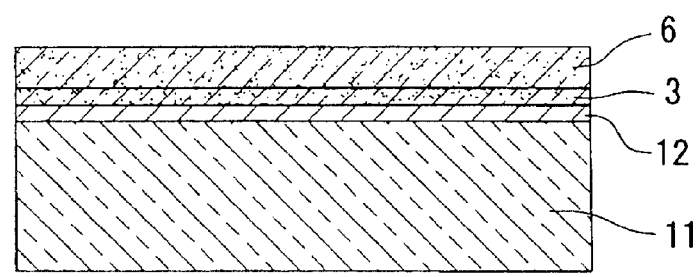
Figure 4D:
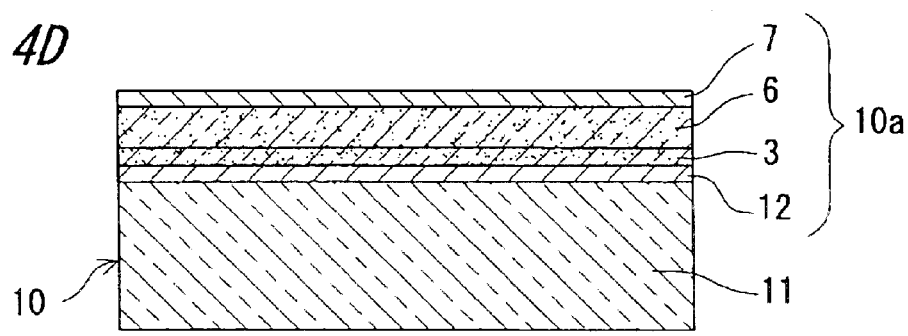

After the completion of the nanocrystallization process, the oxidation process is performed. Through this process, the drift layer 6 composed of a composite nanocrystal layer with a structure as shown in FIG. 3 is formed to obtain a structure as shown in FIG. 4C.

Figure 5:
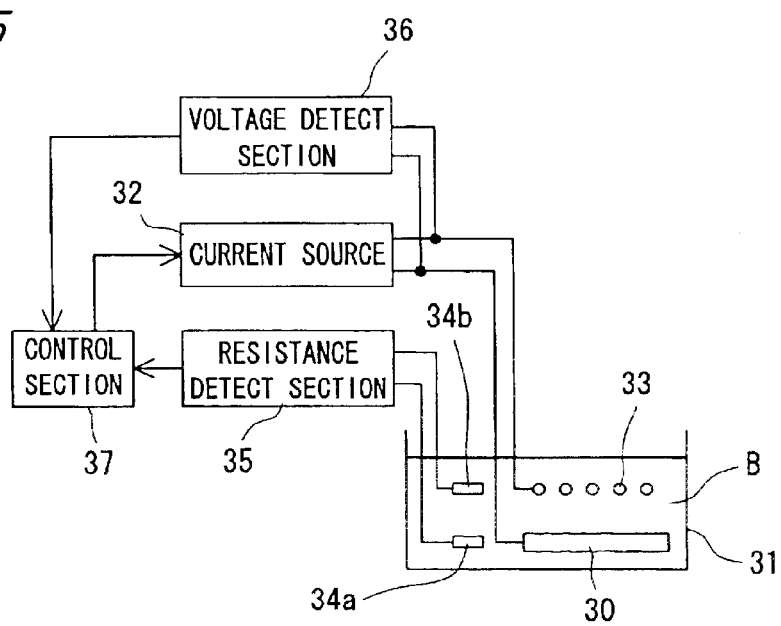
FIG. 5 is a schematic front view of an electrochemical oxidation apparatus concerning the first mode of embodiment.

The oxidation process is performed using an electrochemical oxidation apparatus as shown in FIG. 5. Specifically, an object 30 formed with the composite nanocrystal layer 4 is immersed into an electrolytic solution (e.g. a solution comprising an organic solvent of ethylene glycol, and a solute of 0.04 mol/l potassium nitrate dissolved in the organic solvent) B contained in a processing bath 31. Then, a cathode 33 composed of a grid-like platinum electrode is disposed in opposed relation to the composite nanocrystal layer 4 within the electrolytic solution B. Then, a constant current (e.g. a current having a current density of 0.1 mA/cm²) is supplied from a current source 32 between the lower electrode 12 used as an anode and a cathode 33. In this manner, the oxidation process for electrochemically oxidizing the composite nanocrystal layer 4 is performed to form a drift layer 6 including grains 51, silicon microcrystals 63 and silicon oxide films 52, 64.

This electrochemical oxidation apparatus includes: a resistance detect section 35 for detecting the resistance of the electrolytic solution B contained in a processing bath 31, by use of a pair of resistance-measuring electrodes 34a, 34b to be immersed into the electrolytic solution B; a voltage detect section 36 for detecting the potential difference between the anode and the cathode 33; and a control section 37 for controlling the output of the current source 32 in accordance with a detected voltage from the voltage detect section 36 and a detected resistance value from the resistance detect section 35. The control section 37 is operable to determine a voltage increment V0 (see FIG. 6A) to be caused by the resistance of the electrolytic solution B in accordance with a detected resistance value which is detected by the resistance detect section 35 in advance, and then to control the current source 32 such that a constant current is supplied from the current source 32, so as to initiate an oxidation treatment. The control section 37 is also operable to correct the detected voltage V from the voltage detect section 36 by subtracting the voltage increments V0 from the detected voltage V, and the to discontinue the output of the current source 32 at the time when the corrected voltage Vt reaches a predetermined upper voltage value V1 (see FIG. 6B) so as to terminate the oxidation treatment. In the composite nanocrystal layer 4 formed through the nanocrystallization process in the first mode of embodiment, any remaining region other than the grains 51 and the silicon microcrystals 63 is formed as an amorphous silicon region made of amorphous silicon. In the drift layer 6, the remaining region other than the grains 51, the silicon microcrystals 63, and the silicon oxide films 52, 64 is formed as an amorphous region 65 made of amorphous silicon or partially oxidized amorphous silicon. However, depending on the conditions of the nanocrystallization process, the amorphous region 65 is formed as pores. In this case, such a composite nanocrystal layer 4 may be considered as a porous polycrystalline silicon layer as in conventional electron sources.

After the formation of the drift layer 6, a surface electrode 7 composed of a gold thin film is formed on the drift layer 6, for example, through a vapor deposition method.

Figure 6A:
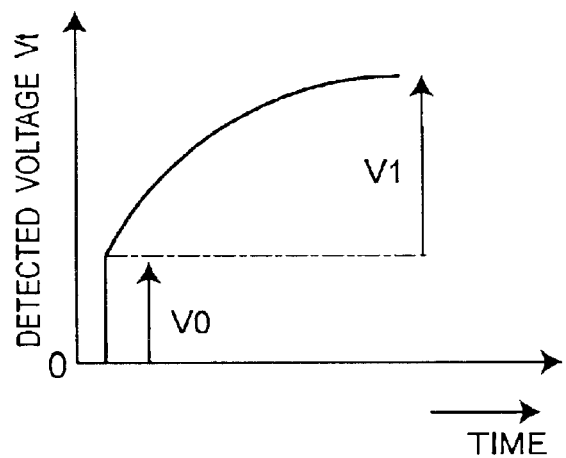
FIG. 6A is a graph showing the relationship between detected voltage V and time in the electrochemical oxidation apparatus in FIG. 5.
Figure 6B:
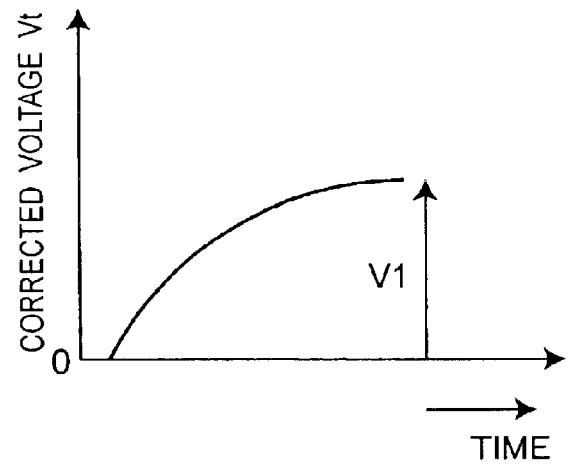
FIG. 6B is a graph showing the relationship between corrected voltage Vt and time in the electron source in FIG. 1.

In the conventional electrochemical oxidation method for forming the drift layer 6, the oxidation treatment is terminated at the time when the voltage between the anode and the cathode 33 reaches a given voltage (V0+V1), as shown in FIG. 6A. In this case, the given voltage includes a voltage increment (V1) caused by the formation of the oxide films (silicon oxide films 52, 64), and another voltage increment V0 due to the resistance of the electrolytic solution B. The voltage increment V0 is varied according to the variation in the specific resistance of the electrolytic solution B depending on the conditions of the electrolytic solution B, such as production conditions, continuous-use conditions or storage conditions; the shape of a cathode electrode; and the surface condition of a sample. Thus, if the given voltage (V0+V1) is a constant value, the voltage increment caused by the formation of the silicon oxide films 52, 64 are varied, and consequently the emission current and/or withstand voltage of the electron source 10 are varied, resulting in undesirably deteriorate process yield.

By contrast, according to the production method of the first mode of embodiment, in the electrochemical oxidation method for electrochemically oxidizing the composite nanocrystal layer 4 as a crystal layer to form the drift layer 6, a certain current is supplied between the anode and the cathode 33 to initiate the oxidation. Then, the oxidation is terminated at the time when the corrected voltage Vt determined by correcting the voltage between the anode and the cathode 33 in accordance with the voltage increment V0 based on the pre-detected resistance of the electrolytic solution B reaches the upper voltage value V1. Thus, the variation in the increment of the voltage between the anode an the cathode 33 in the period between the initiation and termination of the oxidation can be reduced irrespective of the variation in the resistance of the electrolytic solution B depending on the conditions of the electrolytic solution B, such as production conditions, continuous-use conditions or storage conditions. That is, the variation in the voltage increment caused by the formation of the oxide films (silicon oxide film 52, 64) can be reduced to provide reduced variation in the characteristics, such as emission current or withstand voltage, of the electron source 10.

In the electrochemical oxidation method according to the first mode of embodiment, before the current is supplied between the anode and the cathode 33, the resistance of the electrolytic solution is detected using the resistance-measuring electrodes 34a, 34b, and the voltage increment V0 is determined based on the detected resistance value. In this operation of detecting the resistance of the electrolytic solution, the voltage increment V0 can be obtained without supplying any current between the anode and the cathode 33, to prevent the composite nanocrystal layer 4 as a semiconductor layer (crystal layer) from being oxidized during this operation. Preferably, the distance between the resistance-measuring electrodes 34a, 34b is set to be equal to the distance between the object 30 and the cathode 33. Further, in the first mode of embodiment, a parameter corresponding to the distance between the object 30 and the cathode 33, or the shape or dimension of the cathode 33 is entered into the control section 37. Based on this parameter and the detected resistance value from the resistance detect section 35, the control section 35 determines the specific resistance of the electrolytic solution B. Then, the control section 35 determines the voltage increment V0 in accordance with the obtained specific resistance.

The electrolytic solution B for use in the electrochemical oxidation method comprises an organic solvent, and an electrolyte dissolved in the organic solvent. Thus, as compared to a conventional process of electrostatically oxidizing a semiconductor layer in the electrolytic solution consisting of an aqueous solution of sulfuric acid or nitric acid to form a silicon oxide film, the electrolytic solution B can prevent water from being incorporated in the oxide films to provide highly densified silicon oxide films 52, 64. Thus, the obtained silicon oxide films 52, 64 can have higher withstand voltage performance. As described above, if an organic solvent is used in an electrolytic solvent B, the resistance of the electrolytic solution B will often be extremely increased as compared to an electrolytic solution using water as a solvent. This tendency stands out when a nonpolar organic solvent is use. Thus, the electrochemical oxidation method according to the first mode of embodiment is particularly effective to an organic-solvent-based electrolytic solution B having a high resistance which leads to larger voltage increment V0.

When the electron source 10 concerning the first mode of embodiment is used as an electron source of a display, a number of electron source elements 10a may be formed on the side of the above principal surface of the substrate 11 in a matrix arrangement by appropriately patterning the lower electrode 12, the surface electrode 7, drift layer 6 and others. While the first mode of embodiment has been described by taking the production process of the electron source 10 for example, it is understood that the electrochemical oxidation method of the present invention is not limited thereto, but may be used in the production process of various semiconductor devices.

[Second Mode of Embodiment]

A second mode of embodiment of the present invention will be described below. As mentioned above, in the production process of the electron source 10 concerning the first mode of embodiment, the resistance of the electrolytic solution B is measured by the resistance-measuring electrodes 34a, 34b of the electrochemical oxidation apparatus before the oxidation treatment. Then, based on the pre-detected resistance, the detected voltage from the voltage detect section 36 is corrected in consideration of the distance between the object 30 and the cathode 33, and the shape of the cathode 33. However, after the detection, the resistance of the electrolytic solution B can be changed in some cases depending on the surface condition of the object 30.

Figure 7:
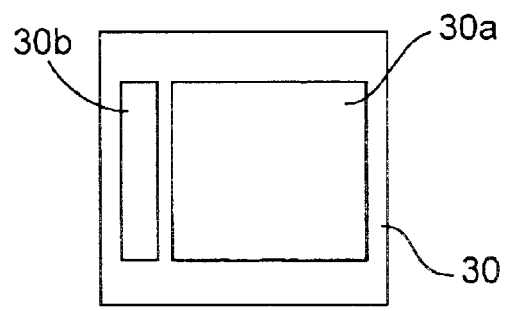
FIG. 7 is a schematic top plan view of an object concerning a second mode of embodiment.

In view of this possibility, as shown in FIG. 7, in the second mode of embodiment, a resistance-measuring region 30b is provided in the principal surface of a semiconductor layer (composite nanocrystal layer 4) formed the an object 30, in addition to or separately from a desired oxidation target region 30a. Before a certain current is supplied between the anode and the cathode 33, the resistance of the electrolytic solution B is detected using the resistance-measuring region 30b, and the voltage increment V0 is determined based on a detected resistance value. The detected value from the voltage detect section 36 is corrected in accordance with the determined voltage increment V0. In this point, the second mode of embodiment is different from the first mode of embodiment.

According to the second mode of embodiment, the resistance of the electrolytic solution B can be detected in the form of including the factor of the surface condition of the composite nanocrystal layer 4 as a semiconductor while preventing the composite nanocrystal layer 4 from being oxidized during the detection of the resistance of the electrolytic solution B. Thus, the difference between the detected resistance value and the actual resistance value of the electrolytic solution at the initiation of current supply can be reduced to provide more reduced variation in the characteristics of the electron source 10. The structure and operation of the electron source 10 are the same as those in the first mode of embodiment, and their drawing and description are omitted.

[Third Mode of Embodiment]

A third mode of embodiment of the present invention will be described below. As mentioned above, in the electrochemical oxidation method according to the second mode of embodiment, it is required to provide the resistance-measuring region 30b to the object 30 in addition to the oxidation target region 30a. However, depending on the pattern shape of the oxidation target region 30a and other factor, any resistance-measuring region 30b cannot be provided in some cases, or leader lines cannot be adequately arranged in the resistance-measuring region 30b in some cases.

Figure 8:
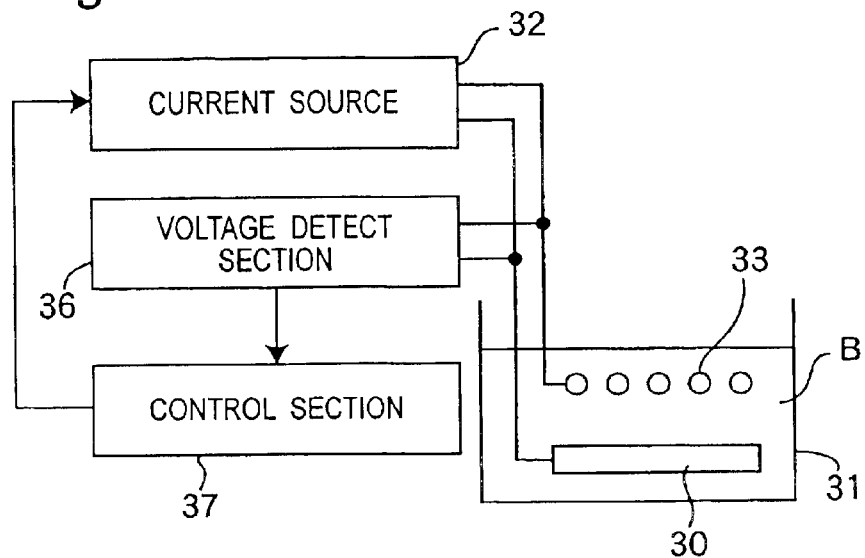
FIG. 8 is a schematic front view of an electrochemical oxidation apparatus for use in production steps of an electron source, concerning a third mode of embodiment.

In view of this possibility, an electrochemical oxidation apparatus as shown in FIG. 8 is used in the third mode of embodiment. In the oxidation treatment of an object 30, before a certain-current is supplied between an anode (lower electrode 12) and a cathode 33, the resistance of an electrolytic solution B is detected using a resistance-monitoring specimen (not shown) which is formed in a shape identical to that of the object 30 formed with a semiconductor layer (composite nanocrystal layer 4) to be electrochemically oxidized. The voltage increment V0 is determined based on the detected resistance value. In this point, the third mode of embodiment is different from the second mode of embodiment.

According to the third mode of embodiment, before a certain current is supplied between the anode and the cathode 33, the resistance of the electrolytic solution B is detected using the resistance-monitoring specimen, and the voltage increment V0 is determined based on the detected resistance value. Thus, any oxidation of the composite nanocrystal layer 4 can be avoided during the detection of the resistance of the electrolytic solution B. Further, the difference between the detected resistance value and the actual resistance value of the electrolytic solution at the initiation of current supply can be reduced to provide more reduced variation in the characteristics of the electron source 10. The structure and operation of the electron source 10 are the same as those in the first mode of embodiment, and their drawing and description are omitted.

[Fourth Mode of Embodiment]

A fourth mode of embodiment of the present invention will be described below. As mentioned above, in the electrochemical oxidation method according to the first to third modes of embodiment, the oxidation treatment is terminated at the time when the voltage between the anode (lower electrode 12) and the cathode 33 reaches the upper voltage value V1. In this case, as compared to the silicon oxide films 52, 64 formed at a position close to the lower electrode 12, the silicon oxide films 52, 64 formed at a position far from to the lower electrode 12 cannot have adequate withstand voltage performance due to its excessively thin film thickness or insufficient density, in some cases.

Figure 10:
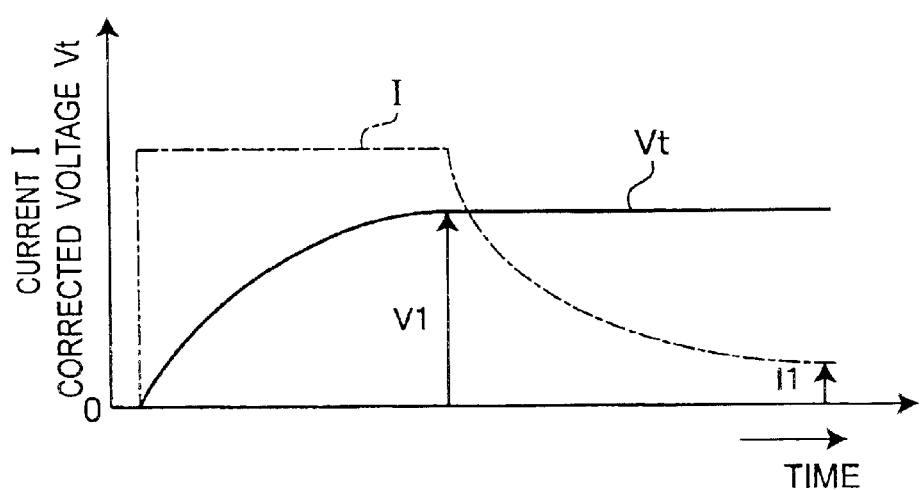
FIG. 10 is a graph showing the relationship between corrected voltage Vt and time in electrochemical oxidation apparatus concerning the fourth mode of embodiment.
Figure 9:
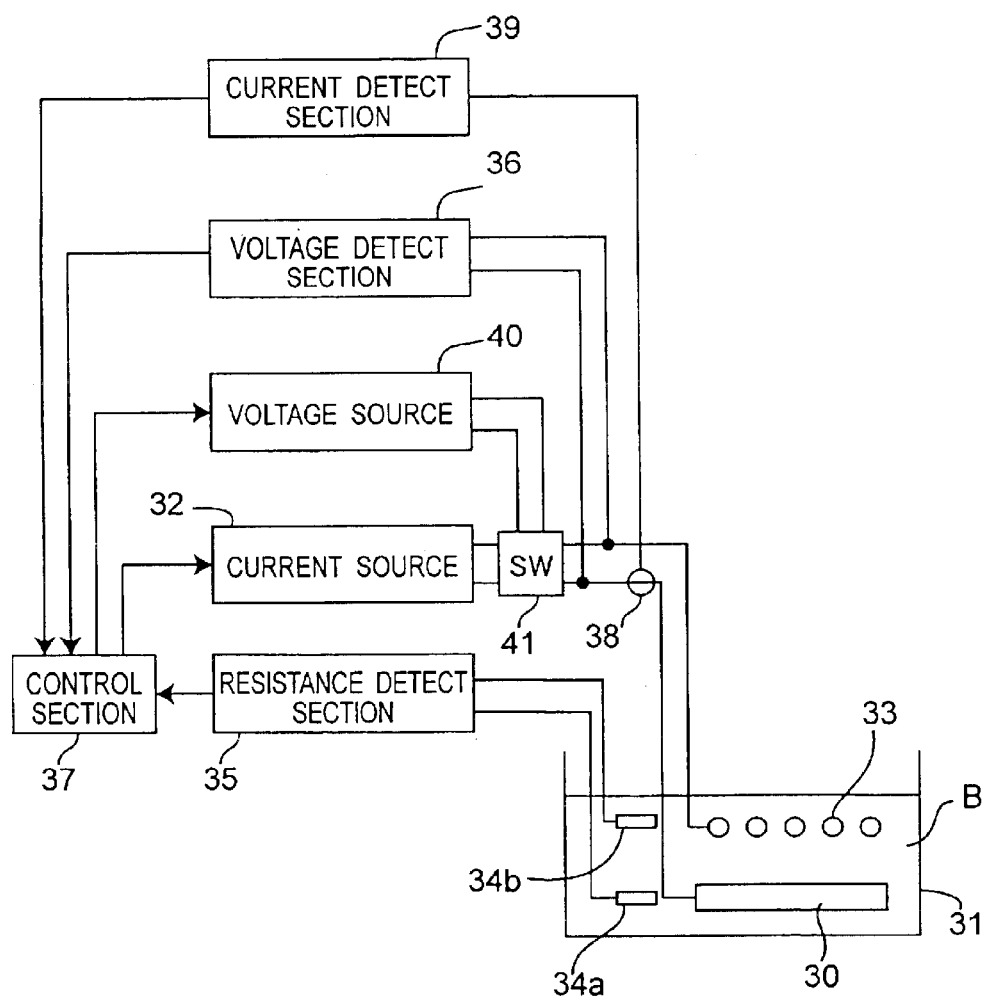
FIG. 9 is a schematic front view of an electrochemical oxidation apparatus for use in production steps of an electron source, concerning a fourth mode of embodiment .

In view of this possibility, an electrochemical oxidation apparatus as shown in FIG. 9 is used in the fourth mode of embodiment. As shown in FIG. 10, after the corrected voltage Vt between the anode and the cathode 33 reaches the upper voltage V1, the current I flowing between the anode and the cathode 33 is reduced while maintaining the corrected voltage Vt at the upper voltage value. Then, the oxidation is terminated at the time when the current I is reduced down to a given value I1.

As shown in FIG. 9, the electrochemical oxidation apparatus concerning the fourth mode of embodiment includes a current detect section 39 for detecting the current flowing between the anode and the cathode 33, through a current censor 38. This electrochemical oxidation apparatus further includes a current source 32, a voltage source 40, and a selector switch 41 for selectively switching between the current source 32 and the voltage source 40. In advance of supplying a current, a control section 37 corrects the upper voltage value V1 in accordance with the voltage increment V0 based on the resistance of an electrolytic solution B. During the reduction of the current I, the control section continuously corrects the corrected voltage Vt in accordance with the voltage increment V0 which is a product of the current flowing through the electrolytic solution B and the resistance of the electrolytic solution B. The above technical concept of the forth mode of embodiment may be applied to the electrochemical oxidation apparatus concerning the second and third modes of embodiment.

According to the fourth mode of embodiment, the variation in the voltage increment in the period between the initiation of current supply and the time when the voltage between the anode and the cathode reaches the upper voltage value can be reduced. Further, in the period between the time when the voltage between the anode and the cathode reaches the upper voltage value and the time when the current is reduced down to the given value I1, the corrected voltage Vt is corrected in response to the change of the current flowing the electrolytic solution. Thus in the above period, the variation in the voltage increment caused by the formation of the oxide films can be suppressed to provide reduced variation in the characteristics of the electron source 10. Furthermore, since the oxidation is terminated only after the current I is reduced down to the given value, the oxide films can be densified to have higher withstand voltage performance.

[Fifth Mode of Embodiment]

A fifth mode of embodiment of the present invention will be described below. An electrochemical oxidation method according to the fifth mode of embodiment will be described by taking the same electron source as that in the first mode of embodiment for example, as one of electronic devices to be formed through the electrochemical oxidation method. That is, the structure, function, advantages and operation of electron emission of the electron source 10 concerning the fifth mode of embodiment is the same as those of the electron source 10 in the first mode of embodiment (see FIGS. 1 to 3).

With reference to FIGS. 11A to 11D, a production process of the electron source 10 concerning the fifth mode of embodiment will be described below.

Figure 11A:
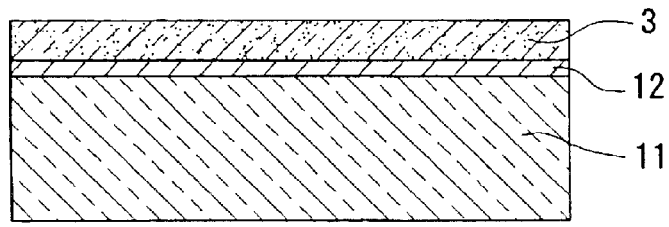
FIGS. 11A to 11D are schematic vertical sectional views of an electron source and intermediate products in major steps of a production process thereof, concerning a fifth mode of embodiment, wherein a production method of the electron source is explained in conjunction therewith.

In this production process, a lower electrode 12 composed of a metal film is first formed on one of the principal surfaces of an insulative substrate 11, and then a non-doped polycrystalline silicon layer 3 is formed on the entire principal surface of the insulative substrate 11 to obtain a structure as shown in FIG. 11A, in the same way as that in the first mode of embodiment.

Figure 11B:
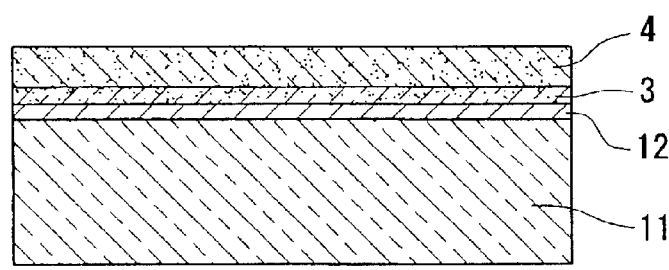

After the formation of the polycrystalline silicon layer 3, a nanocrystallization process (anodization step) is performed to form a composite nanocrystal layer 4 including a number of polycrystalline silicon grains 51 (see FIG. 3) and a number of silicon microcrystals 63 (see FIG. 3) which are mixed together. In this manner a structure as shown in FIG. 11B is obtained. The nanocrystallization process is the same as that in the first mode of embodiment.

Figure 11C:
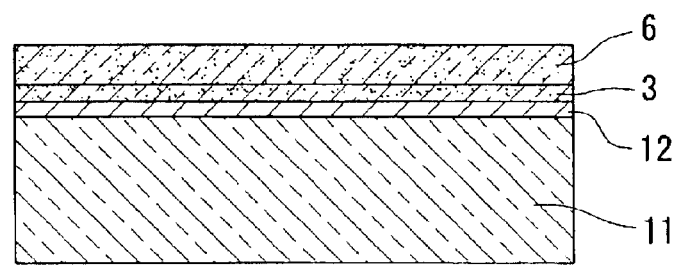
Figure 23A:
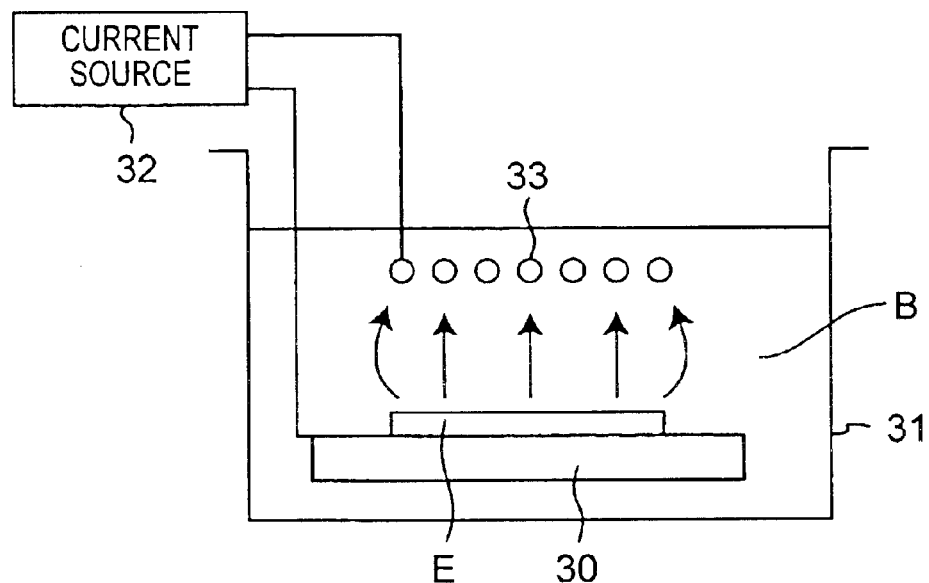
FIG. 23A is a schematic front view of a conventional electrochemical oxidation apparatus.
Figure 23B:
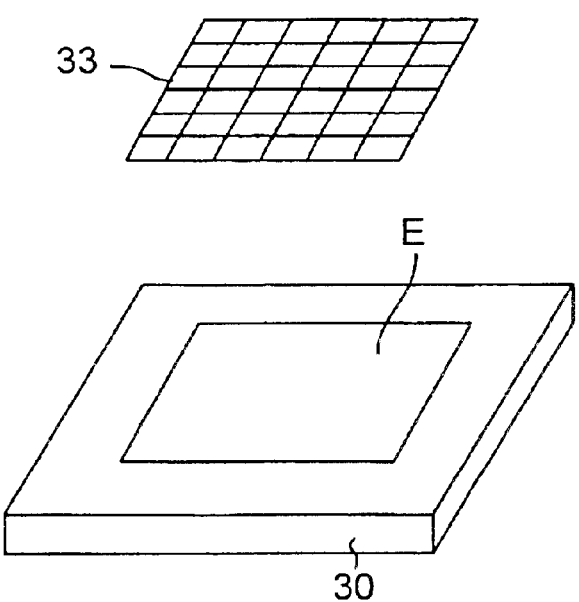
FIG. 23B is a schematic fragmentary perspective view of the electrochemical oxidation apparatus in FIG. 23A.

After the completion of the nanocrystallization process, an oxidation process is performed to electrochemically oxidize the composite nanocrystal layer 4. Through this process, a drift layer 6 with a structure as shown in FIG. 3 is formed to obtain a structure as shown in FIG. 11C. The oxidation process (oxidation step) is performed using the aforementioned electrochemical oxidation apparatus in FIG. 12A to electrochemically oxidize the composite nanocrystal layer 4 as a semiconductor layer (crystal layer). This electrochemical oxidation apparatus has fundamentally the same structure as that of the conventional electrochemical oxidation apparatus in FIG. 23, except that the shape of a cathode 33 is adjusted to control a current density in the principal surface of the polycrystalline silicon layer 3, so that the current density in the periphery of a target region E is restrained in increasing to be greater than that in the remaining target region E.

Figure 12A:
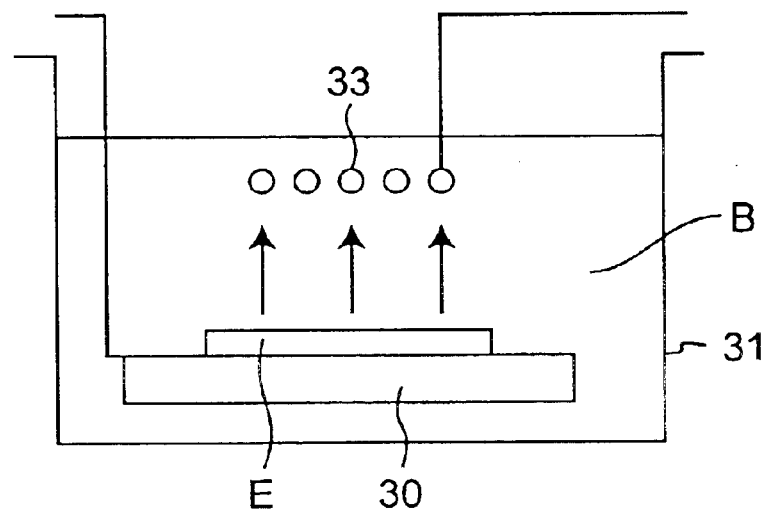
FIG. 12A is a schematic front view of the electrochemical oxidation apparatus concerning the fifth mode of embodiment.
Figure 12B:
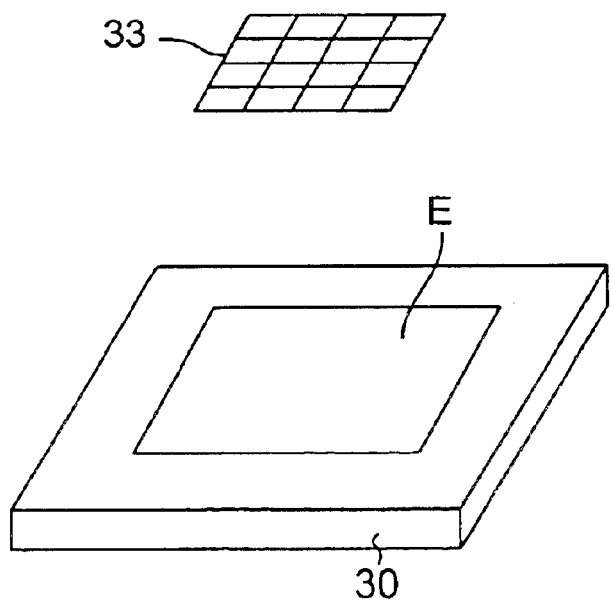
FIG. 12B is a schematic fragmentary perspective view of the electrochemical oxidation apparatus in FIG. 12A.

Specifically, as shown in FIGS. 12A and 12B, a grid-like cathode 33 is formed to have an outer dimension less than that of the target region E (oxidation target region), so that the current density in the periphery of the polycrystalline silicon layer 3 is restrained in increasing to be greater than that in the remaining region other than the target region E. In other words, the shape of the cathode 33 is determined such that the specific surface area per unit area in the periphery of the cathode is less than that in the remaining region of the cathode 33, to allow the entire surface of the target region E to have an even current density. In this point, the electrochemical oxidation method according to the fifth mode of embodiment is different from the conventional electrochemical oxidation method.

In the oxidation process, a solution comprising an organic solvent, e.g. ethylene glycol, and a solute of 0.04 mol/l potassium nitrate dissolved in the organic solvent is used as a specific electrolytic solution B to be contained in a processing bath 31. An object 30 formed with the composite nanocrystal layer 4 is immersed into the electrolytic solution B. Then, the cathode 33 is disposed in opposed relation to the composite nanocrystal layer 4 within the electrolytic solution B. Then, a constant current (e.g. a current having a current density of 0.1 mA/cm$^2$) is supplied from the current source between an anode (lower electrode 12) and the cathode 33 to perform the oxidation process for electrochemically oxidizing the composite nanocrystal layer 4. Through this process, a drift layer 6 including grains 51, silicon microcrystals 63 and silicon oxide films 52, 64 is formed.

In the composite nanocrystal layer 4 formed through the nanocrystallization process in the fifth mode of embodiment, any remaining region other than the grains 51 and the silicon microcrystals 63 is formed as an amorphous silicon region made of amorphous silicon. In the drift layer 6, the remaining region other than the grains 51, the silicon microcrystals 63 and the silicon oxide films 52, 64 is formed as an amorphous region 65 made of amorphous silicon or partially oxidized amorphous silicon. However, depending on the conditions of the nanocrystallization process (anodization step), the amorphous region 65 is formed as pores. In this case, such a composite nanocrystal layer 4 may be considered as a porous polycrystalline silicon layer as in conventional electron sources.

Figure 11D:
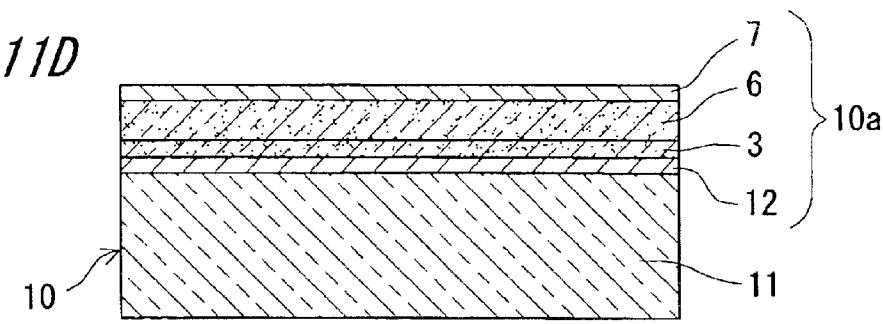

After the formation of the drift layer 6, a surface electrode 7 composed of a gold thin film is formed on the drift layer 6, for example, through a vapor deposition method. In this way, an electron source 10 with a structure as shown in FIG. 11D is obtained.

According to the production process of the electron source 10 concerning the fifth mode of embodiment, the current density in the electrochemical-oxidation target region E as the principal surface of a semiconductor layer can be controlled such that the current density in the periphery of the target region E is restrained in increasing to be greater than that in the remaining target region E. Thus, as compared to the conventional method, the in-plane variation in the current density of the target region E can be reduced. That is, as compared to the conventional method, the in-plane variation in the emission current Ie of the electron source 10 can be reduced, or the in-plane variation in the characteristics of electron devices can be reduced. In addition, the current density in the target region E as the principal surface of a semiconductor layer can be controlled only by adjusting the shape of the cathode 33. Thus, as compared to the conventional method, the in-plain variation in the current density of the target region E can be reduced only by adjusting the shape of the cathode 33, to provide reduced in-plane variation in the emission current Ie of the electron source 10 at a low cost.

The above technical concept can be applied to a nanocrystallization process using an anodization method.

[Sixth Mode of Embodiment]

A sixth mode of embodiment of the present invention will be described below. As mentioned above, in the electrochemical oxidation method according to the fifth mode of embodiment, the cathode 33 is formed to have an outer dimension less than that of the target region E so as to provide enhanced in-plane evenness in the current density of the target region E. However, depending on the distance between the target region E and the cathode 33 or the specific resistance of the electrolytic solution, this method cannot sufficiently equalize the current density of the target region E in some cases, because the parallel lines constituting the cathode 33 have the same pitch.

In view of this possibility, in the sixth mode of embodiment, an electrochemical oxidation apparatus as shown in FIG. 13 is used to electrochemically oxidize the target region E of an object 30. The construction and operation of an electron source 10 concerning the sixth mode of embodiment is the same as those of the electron source 10 in the first mode of embodiment, and their drawing and description will be omitted.

Figure 13A:
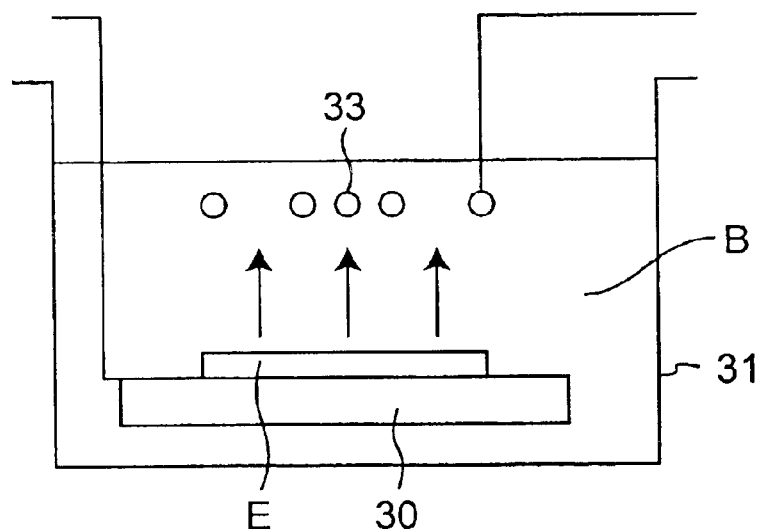
FIG. 13A is a schematic front view of an electrochemical oxidation apparatus concerning a sixth mode of embodiment.
Figure 13B:
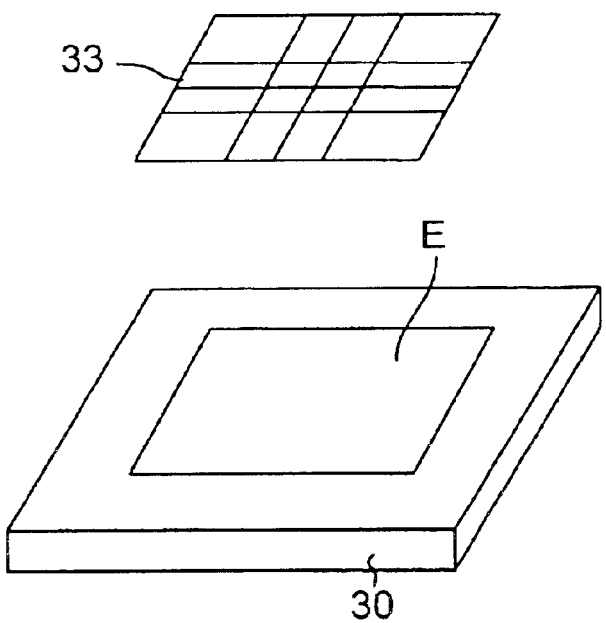
FIG. 13B is a schematic fragmentary perspective view of the electrochemical oxidation apparatus in FIG. 13A.

The electrochemical oxidation apparatus concerning the six mode of embodiment has fundamentally the same structure as that of the electrochemical oxidation apparatus in the fifth mode of embodiment except for the shape of the cathode 33. As shown in FIGS. 13A and 13B, the outer dimension of the cathode 33 is approximately the same as that of the target region E as in the conventional apparatus.

The adjacent parallel linens of the cathode 33 are arranged to have a larger pitch in the periphery of the cathode 33 than that in the central zone of the cathode 33, so as to provide enhanced evenness in the current density of the target region E. In other words, in the sixth mode of embodiment, the pitch of the adjacent parallel lines of the grid-like cathode 33 is changed in such a manner that the current density in the periphery of the target region E is restrained in increasing to be greater than that in the remaining target region E. More specifically, the cathode 33 is adjusted to have a shape allowing the specific surface area per unit area in the periphery of the cathode 33 to be less than that of the remaining target region 33, so as to control the current density of the target region E as the principal surface of a semiconductor layer.

Figure 13C:
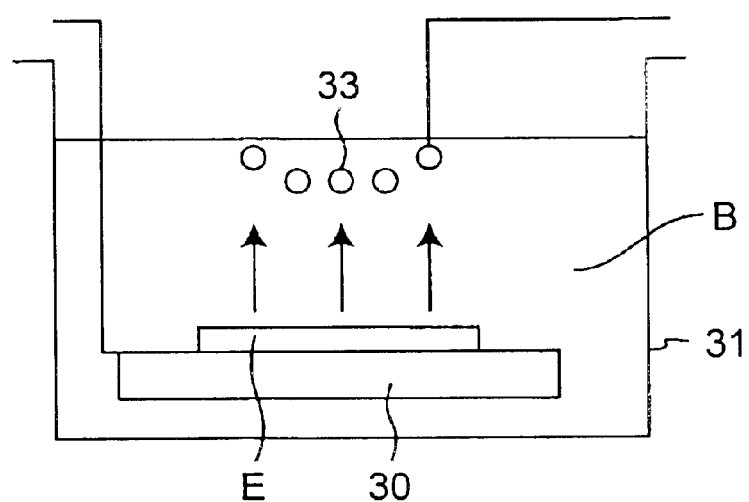
FIG. 13C is a schematic front view of another electrochemical oxidation apparatus concerning the sixth mode of embodiment.
Figure 13D:
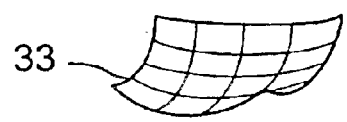
FIG. 13D is a schematic fragmentary perspective view of the electrochemical oxidation apparatus in FIG. 13C.
Figure 13D:
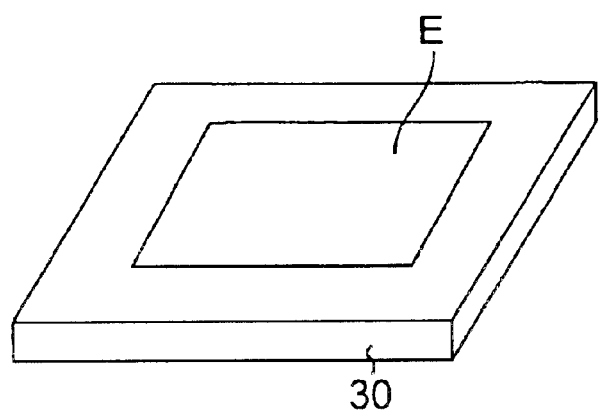

In the sixth mode of embodiment, an electrochemical oxidation apparatus as shown in FIGS. 13C and 13D may also be used. The cathode 33 in this apparatus is formed to have a shape allowing the distance between the cathode 33 and the target region E to be increased in the periphery of the cathode 33. Thus, the resistance of the electrolytic solution B in the periphery of the cathode 33 becomes higher than that in the remaining region of the cathode 33, so as to provide enhanced evenness in the current density of the target region E. That is, the distance between the cathode and the target region E (treatment region) is adjusted to change the resistance due to the electrolytic solution B in between the central zone and peripheral zone of the target region E so as to control the current density of the target region E.

In this way, as with the fifth mode of embodiment, the six mode of embodiment can control the current density of the principal surface of the semiconductor layer (polycrystalline silicon layer 3 and composite nanocrystal layer 4) in such a manner that the current density in the periphery of the electrochemical-oxidation target region is restricted in increasing to be greater than that in the remaining target region E. Thus, as compared to the conventional method, the in-plane variation in the current density of the target region E can be reduced to provide reduced in-plane variation in the emission current Ie of the electron source 10. In addition, the current density in the semiconductor layer can be controlled only by adjusting the shape of the cathode 33. Thus, as compared to the conventional method, the in-plain variation in the current density of the target region E can be reduced only by adjusting the shape of the cathode 33, to provide reduced in-plane variation in the emission current Ie of the electron source 10 at a low cost.

The above technical concept can be applied to a nanocrystallization process using an anodization method.

[Seventh Mode of Embodiment]

A seventh mode of embodiment of the present invention will be described below. As mentioned above, in the fifth and sixth modes of embodiment, the shape of the cathode 33 is adjusted to equalize the current density of the target region E. In this case, the shape of the cathode 33 has to be designed in conformity with the shape of the target region E.

In view of this point, in the seventh mode of embodiment, an electrochemical oxidation apparatus as shown in FIG. 14 is used to electrochemically oxidize the target region E of a semiconductor composed of a polycrystalline silicon layer 3 in an object 30. The construction and operation of an electron source concerning the seventh mode of embodiment is the same as those of the electron source in the fifth mode of embodiment, and their drawing and description will be omitted.

Figure 14A:
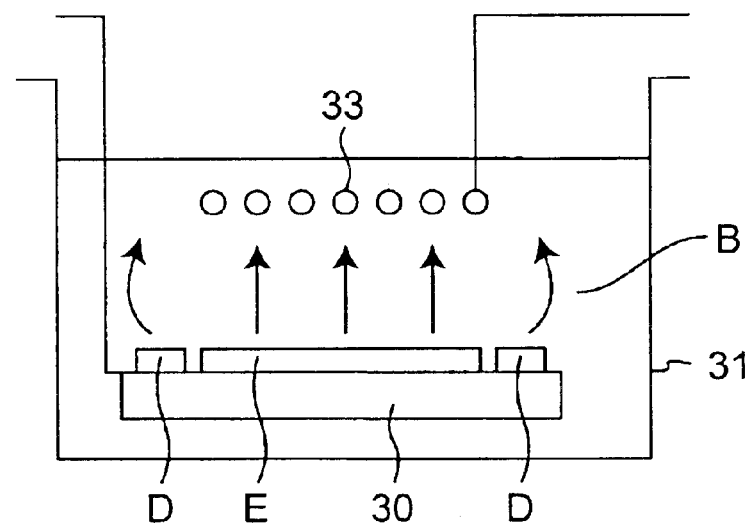
FIG. 14A is a schematic front view of an electrochemical oxidation apparatus concerning a seventh mode of embodiment.
Figure 14B:
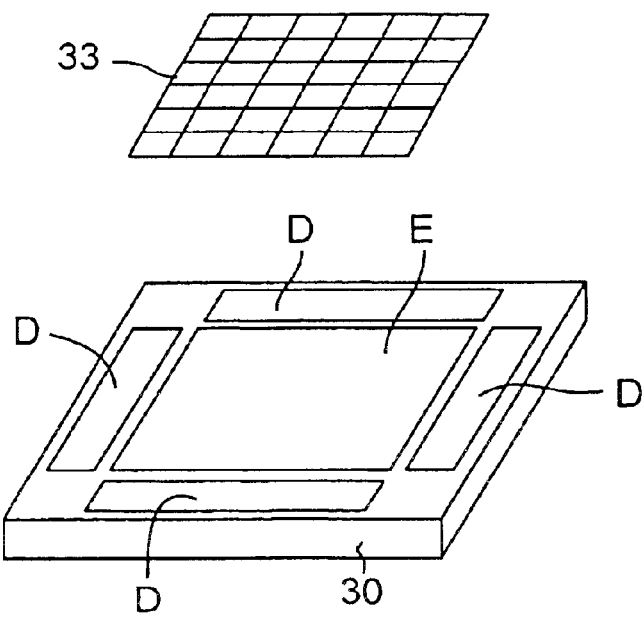
FIG. 14B is a schematic fragmentary perspective view of the electrochemical oxidation apparatus in FIG. 14A.

The electrochemical oxidation apparatus concerning the seventh mode of embodiment is fundamentally the same as that in the fifth mode of embodiment. As shown in FIGS. 14A and 14B, in the seventh mode of embodiment, a dummy region D capable of reducing a current density is provided in the periphery of a target region of a semiconductor layer, so as to control the current density of the principal surface of the semiconductor. Thus, as compared to the conventional method, the in-plane variation in the current density of the target region can be reduced without modifying the shape of the cathode 33, to provide reduced in-plane variance in the emission current Ie of the electron source 10 at a low cost. The dummy region D is made of the same material as that of the target region, and may be formed in conjunction with the target region E.

[Eighth Mode of Embodiment]

Figure 15:
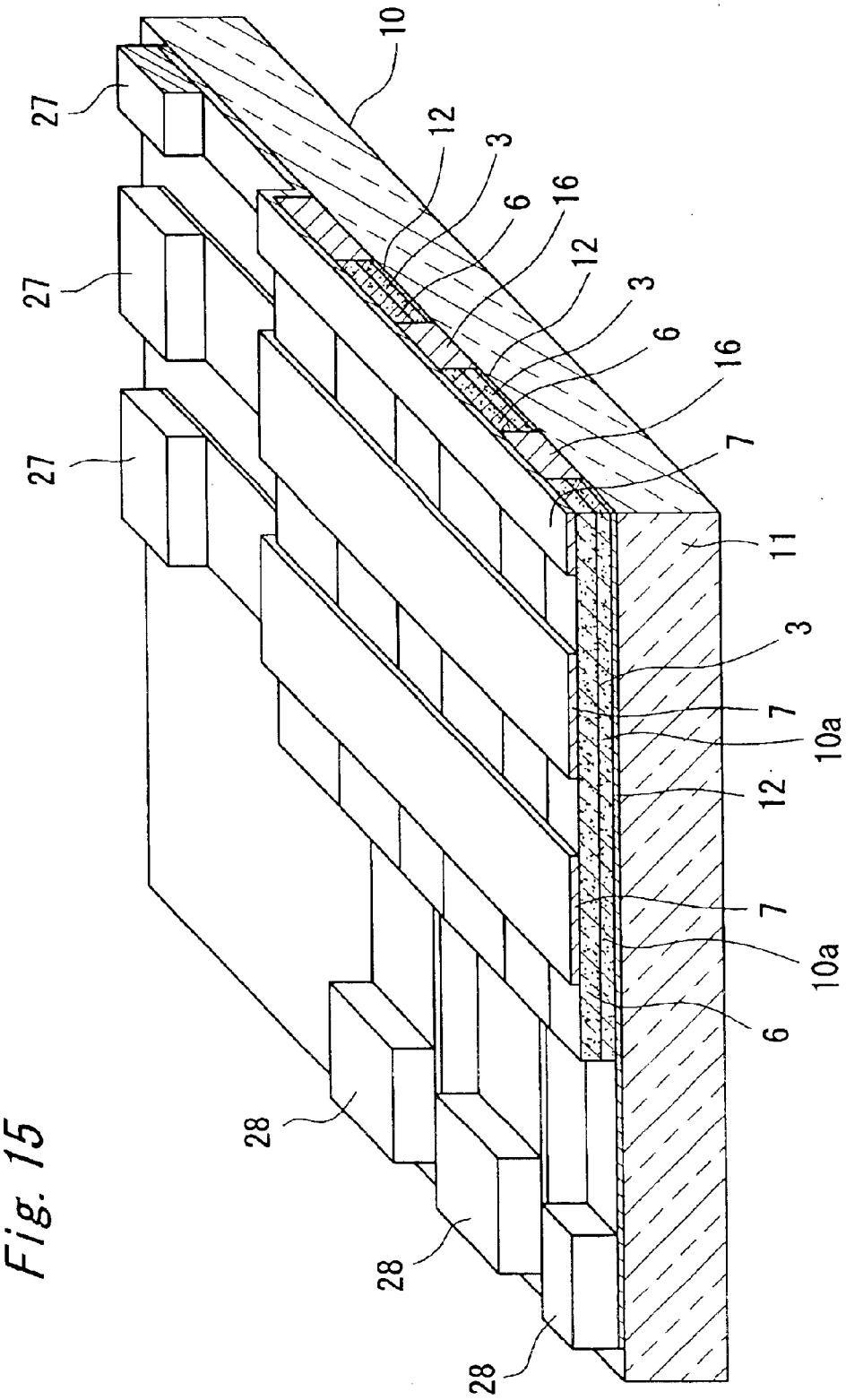
FIG. 15 is a fragmentary perspective view of a display using an electron source concerning an eighth mode of embodiment.

An eighth mode of embodiment of the present invention will be described below. An electron source 10 concerning the eighth mode of embodiment has approximately the same structure as that of the conventional electron source 10 in FIG. 22. Specifically, as shown in FIG. 15, the electron source 10 comprises a plurality of lower electrodes 12 arranged in lines on one of the principal surfaces of an insulative substrate 11, a plurality of polycrystalline silicon layers 3 each of which is formed on the corresponding lower electrode 12 in a superimposed manner, a plurality of drift layers 6 each of which is formed on the corresponding polycrystalline silicon layer 3 in a superimposed manner, a plurality of isolation layers 16 each of which is composed of a polycrystalline silicon layer and embedded between the adjacent drift layers 6, and a plurality of surface electrodes 7 which are formed on the drift layers 6 and the isolation layers 16, and arranged in lines to extend in the crosswise direction of the lower electrodes 12 so as to cut across the drift layers 6 and the isolation layers 16. As with the fifth mode of embodiment, each of the drift layer 6 is composed of a composite nanocrystal layer.

As with the conventional electron source 10, in the electron source 10 concerning the eighth mode of embodiment, the drift layers 6 are partly sandwiched between the corresponding lower electrodes 12 arranged on the above principal surface of the insulative substrate 11 and the corresponding surface electrodes 7 arranged in the crosswise direction of the lower electrodes 12, at the regions of the drift layers 6 corresponding to the intersecting points between the corresponding lower electrodes 12 and the corresponding surface electrodes 7. Thus, a certain voltage can be applied between appropriately selected one of the plural pairs of the surface electrode 7 and the lower electrode 12, to allow a strong electric field to act on the region of the drift layer 6 corresponding to the intersecting point between the selected surface electrode 7 and lower electrode 12 so as to emit electrons from the region. This configuration is equivalent to an electron source in which a plurality of electron source elements 10a, each of which comprises the lower electrode 12, the polycrystalline silicon layer 3 on the lower electrode 12, the drift layer 6 on the polycrystalline layer 3, and the surface electrode 7 on the drift layer 6, are arranged, respectively, at the lattice points of a matrix (lattice) formed by a group of the surface electrodes 7 and a group of the lower electrodes 12a. One of the pairs of the surface electrode 7 and the lower electrode 12 to be applied with a certain voltage can be selected to allow electrons to be emitted from desired one of the electron source elements 10a. Each of the lower electrodes 12 is formed in a strip shape, and provided with a pad 28 on each of the longitudinal ends thereon. Each of the surface electrodes 7 is also formed in a strip shape, and provided with a pad 27 on the extended portion from each of the longitudinal ends thereof. The electron source elements 10a are provided to pixels, respectively.

Figure 22:
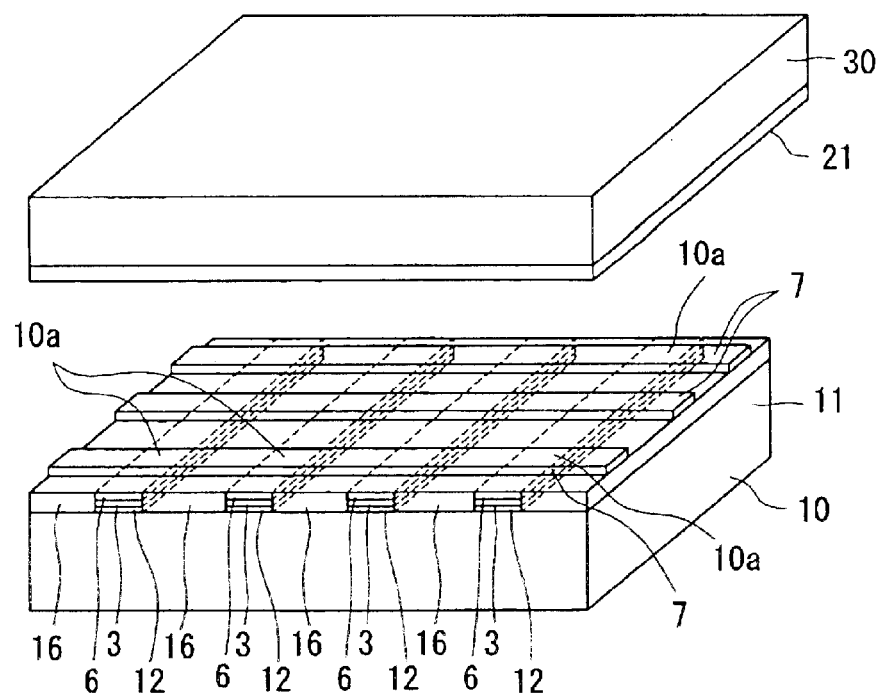
FIG. 22 is a schematic perspective view of a display using the electron source in FIG. 21.

The operation of the electron source 10 concerning the eighth mode of embodiment is approximately the same as that of the conventional electron source 10 in FIG. 22. Specifically, in this electron source 10, the surface electrodes 7 are disposed in a vacuum space, and a collector electrode (anode electrode) 21 is provided to a faceplate 30 disposed in oppose relation to the surface electrodes 7. A DC current Vps is applied to allow selected one of the surface electrodes 7 to serve as a positive pole relative to the corresponding lower electrode 12, and a DC voltage Vc is applied to allow the anode electrode to serve as a positive pole relative to the selected surface electrode 7. The resultingly generated electric field acts on the drift layer 6, and thus electrons injected from the lower electrode 12 into the drift layer 6 is emitted through the surface electrode 7 after drifting in the drift layer 6.

As with the first mode of embodiment, the drift layer 6 has the structure in FIG. 3. The electron source 10 concerning the eighth mode of embodiment emits electrons in the same mode as that in the first mode of embodiment. This electron source 10 allows electron beams emitted from the surface electrode 7 to uniformly direct in the normal direction of the surface electrode 7, and thus has no heed for providing a shadow mask or electron-focusing lens. Thus, the electron source 10 can facilitate reducing the thickness of a display.

The electron source 10 concerning the eighth mode of embodiment can be produced according to the production process in the fifth mode of embodiment. For example, the drift layer 6 can be generally produced by the following steps. A non-doped polycrystalline silicon layer is first deposited on the above entire principal surface of the insulative substrate 11. A portion of the polycrystalline silicon layer corresponding to the drift layer 6 is then anodized through the same nanocrystallization process as that in the fifth mode of embodiment to form a composite nanocrystal layer therein. Then, the composite nanocrystal layer is electrochemically oxidized through the same oxidation process as that in the fifth mode of embodiment. In this way, the drift layer 6 is formed. While the nanocrystallization process and the oxidation process in the eighth mode of embodiment are the same as those in the fifth mode of embodiment, the nanocrystallization process and the oxidation process in the fifth or seventh mode of embodiment may also be used.

Figure 16:
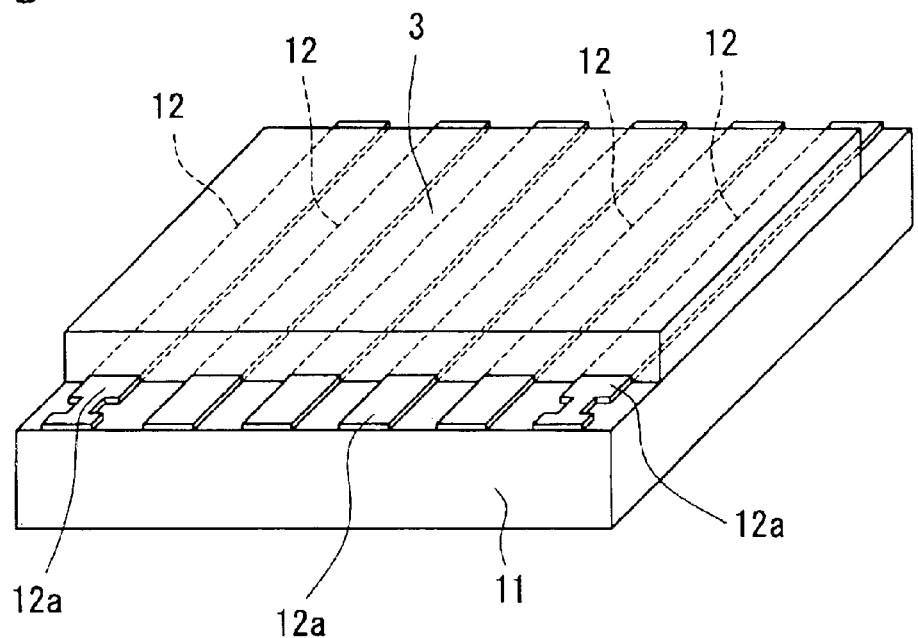
FIG. 16 is a perspective view of an intermediate product in major steps of a production process of a display using the electron source in FIG. 15.

Further, as shown in FIG. 16, one or more current-feeding wirings 12a for supplying current to the corresponding lower electrodes 12 located in the periphery of the polycrystalline silicon layer 3 as a semiconductor layer may be designed to have a width less than that of current-feeding wirings 12a for supplying current to other corresponding lower electrodes 12, so as to control the current density of the principal surface of the semiconductor layer during the anodization and electrochemical oxidation treatments. In this case, as compared with the conventional method, the variation in the current density of the target region E can be reduced without modifying the shape of the cathode 33. Thus, the variation in the in-plane emission current Ie of the electron source 10 can be educed at a low cost.

[Ninth Mode of Embodiment]

A ninth mode of embodiment of the present invention will be described below. An electrochemical oxidation method according to the ninth mode of embodiment will be described by taking the same electron source as that in the first mode of embodiment for example, as one of electronic devices to be formed through the anodization method and electrochemical oxidation method. That is, the structure, function, advantages and operation of electron emission of the electron source 10 concerning the ninth mode of embodiment is the same as those of the electron source 10 in the first mode of embodiment (see FIGS. 1 to 3). When the electron source 10 concerning the ninth mode of embodiment is used as an electron source of a display, a number of electron source elements 10a may be formed on the side of one of the principal surfaces of a substrate 11 in a matrix arrangement by appropriately patterning the lower electrode 12, the surface electrode 7, drift layer 6 and others.

Figure 17A:
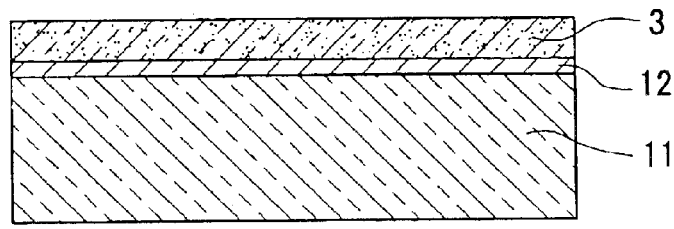
FIGS. 17A to 17D are schematic vertical sectional views of an electron source and intermediate products in major steps of a production process thereof, concerning a nine mode of embodiment, wherein a production method of the electron source is explained in conjunction therewith.

With reference to FIGS. 17A to 17D, a production process of this electron source 10 concerning the ninth mode of embodiment will be described below. As with the first mode of embodiment, a lower electrode 12 composed of a metal film is first formed on one of the principal surfaces of an insulative substrate 11, and a non-doped polycrystalline silicon layer 3 is formed on the entire principal surface of the substrate 11, to obtain a structure as shown in FIG. 17A.

Figure 17B:
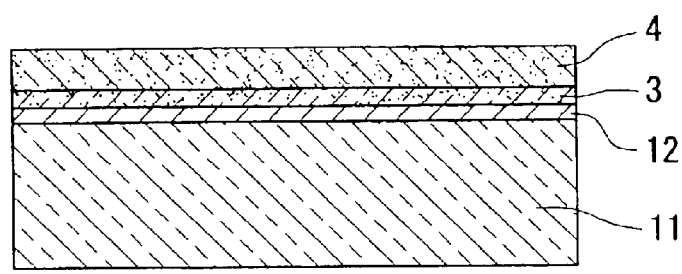

After the formation of the polycrystalline silicon layer 3, the nanocrystallization process (anodization step) is performed to form a composite nanocrystal layer 4 including a number of polycrystalline silicon grains 51 (see FIG. 3) and a number of silicon microcrystals 63 (see FIG. 3) which are mixed together. In this manner a structure as shown in FIG. 17B is obtained.

Figure 17C:
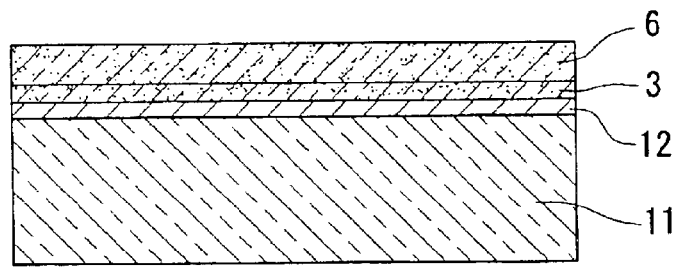
Figure 17D:
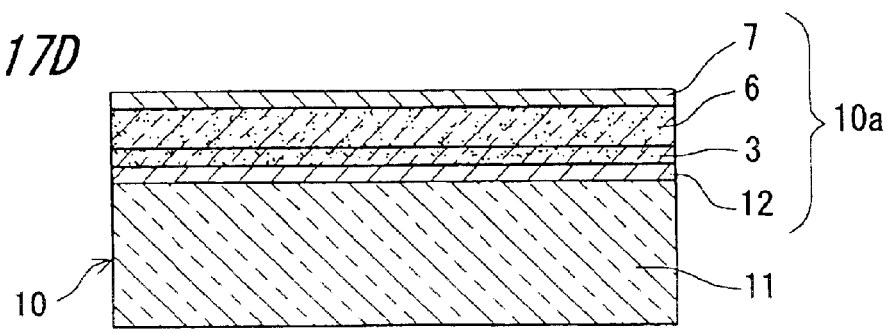

The nanocrystallization process is performed using an anodization apparatus as shown in FIG. 24A to anodize the polycrystalline silicon layer 3 as a semiconductor layer. After the completion of the nanocrystallization process, the oxidation process is performed to electrochemically oxidize the composite nanocrystal layer 4. Through this process, the drift layer 6 composed of a composite nanocrystal layer with a structure as shown in FIG. 3 is formed to obtain a structure as shown in FIG. 17C. After the formation of the drift layer 6, a surface electrode 7 composed of a gold thin film is formed on the drift layer 6, for example, through a vapor deposition method. In this way, an electron source 10 with a structure as shown in FIG. 17D is obtained.

Figure 18:
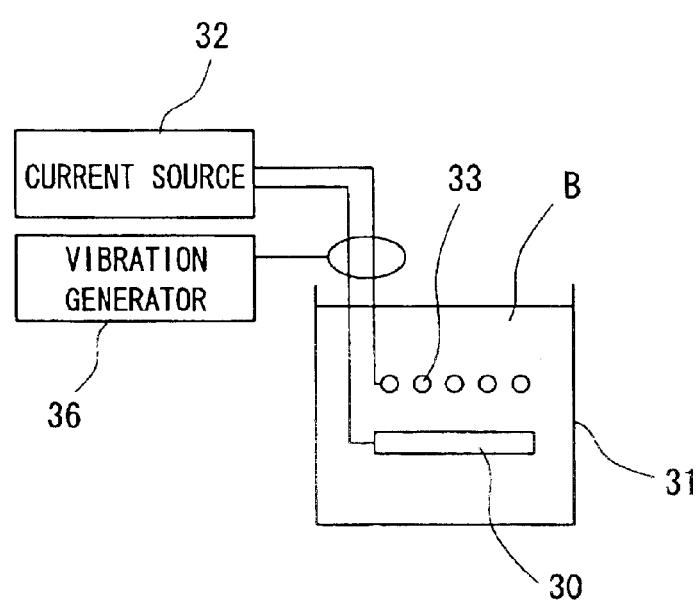
FIG. 18 is a schematic front view of an electrochemical oxidation apparatus concerning the nine mode of embodiment.

The nanocrystallization process is the same as that in the first mode of embodiment. In the oxidation process (oxidation step), an electrochemical oxidation apparatus as shown in FIG. 18 is used to electrochemically oxidized the composite nanocrystal layer 4 as a semiconductor layer (crystal layer). In the oxidation process, a solution comprising an organic solvent, e.g. ethylene glycol, and a solute of 0.04 mol/l potassium nitrate dissolved in the organic solvent is used as a specific electrolytic solution B to be contained in a processing bath 31. An object 30 formed with the composite nanocrystal layer 4 is immersed into the electrolytic solution B. Then, a cathode 33 is disposed in opposed relation to the composite nanocrystal layer 4 within the electrolytic solution B. Then, a constant current (e.g. a current having a current density of 0.1 mA/cm$^2$) is supplied from a current source between an anode (lower electrode 12) and the cathode 33 to perform the oxidation process for electrochemically oxidizing the composite nanocrystal layer 4. Through this process, a drift layer 6 including grains 51, silicon microcrystals 63 and silicon oxide films 52, 64 (see FIG. 3) is formed.

During the oxidation treatment, the voltage between the anode and the cathode 33 is continuously detected by voltage detect means (not shown), and the oxidation treatment is terminated at the time when the voltage between the anode and the cathode 33 is increased by a desired voltage value from the voltage at the initiation of the oxidation treatment. In the period of supplying the current between the anode and cathode 33, the object 30 and the cathode are vibrated by the output of a vibration generator 36. Thus, even if an electrochemical reaction forms air bubbles on the principal surface of the composite nanocrystal layer 4 of the object 30 and the surface of the cathode 33 in the current supply period, the air bubbles will be immediately released therefrom, so as to prevent the air babbles formed on the principal surface of the composite nanocrystal layer 4 from masking the principal surface and suppressing the electrochemical oxidation reaction or to prevent the air babbles from suppressing the reaction to be caused in the electrochemical-oxidation target region. This technique makes it possible to reduce the in-plane variation in the silicon oxide films 52, 64 to be formed in the target region. In addition, this technique can prevent increase in the detected voltage from the voltage detect means otherwise caused by the air bubbles formed on the cathode 33, and prevent deterioration in the withstand voltage performance of the silicon oxide films 52, 64.

The vibration of the object 30 using the vibration generator 36 involves the risk of damage in a porous silicon layer. In view of this possibility, instead of vibrating the object 30 using the vibration generator 36, a vibrator (not shown) may be disposed in the electrolytic solution B to vibrate the electrolytic solution B in the current supply period so as to prevent air babbles generated through the electrochemical oxidation reaction from remaining on the target region and suppressing the electrochemical oxidation reaction, without damage in the porous silicon layer. Further, this technique can prevent increase in the detected voltage from the voltage detect means otherwise caused by the air bubbles formed on the cathode 33, and thus prevent deterioration in the withstand voltage performance of the silicon oxide films 52, 64.

According to the ninth mode of embodiment, even if the electrochemical reaction forms air bubbles generated on the principal surface of the composite nanocrystal layer 14 in the oxidation period, the air bubbles will be immediately released therefrom so as to prevent the air babbles from masking the principal surface and suppressing the electrochemical oxidation reaction. In addition, this method can provide reduced in-plane variation in the film thickness or film quality of the silicon oxide films 52, 64 to be formed in the electrochemical-oxidation target region. Thus, the in-plane variation in the withstand voltage performance of the silicon oxide films 52, 64 can be reduced as compared to the conventional method. Further, this method can prevent increase in the detected voltage from the voltage detect means otherwise caused by the air bubbles formed on the cathode 33, and thus prevent deterioration in the withstand voltage performance of the silicon oxide films 52, 64. This allows the withstand voltage performance of the silicon oxide films 52, 64 to be varied in each of lots.

The above technical concept can be applied to a nanocrystallization process using an anodization method.

[Tenth Mode of Embodiment]

Figure 19:
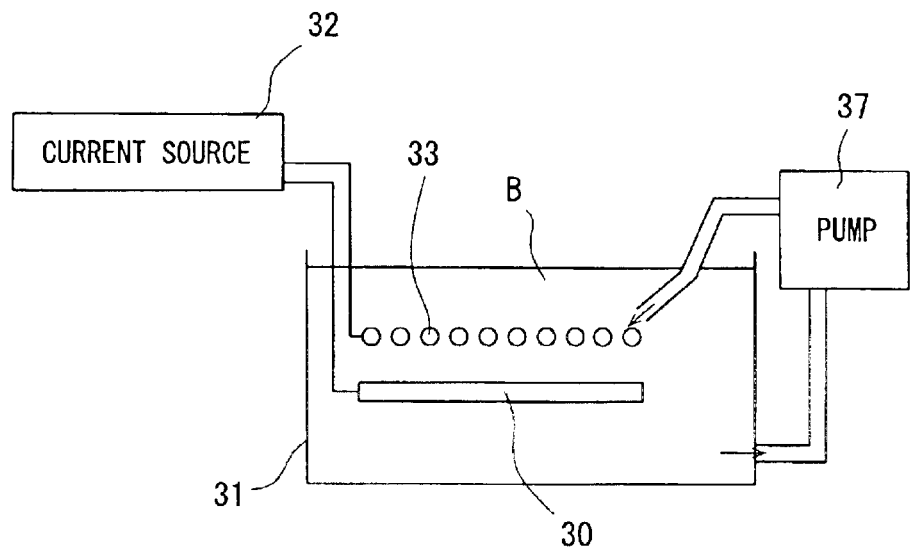
FIG. 19 is a schematic front view of an electrochemical oxidation apparatus concerning a tenth mode of embodiment.
Figure 20:
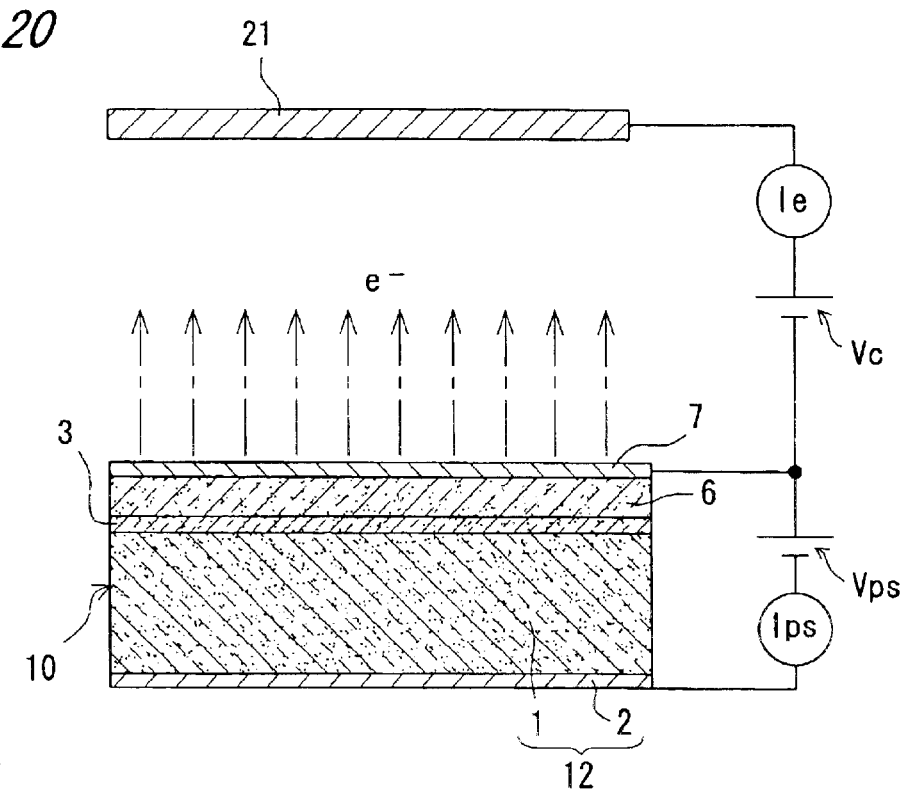
FIG. 20 is an explanatory diagram showing the operation of a conventional electron source.
Figure 21:
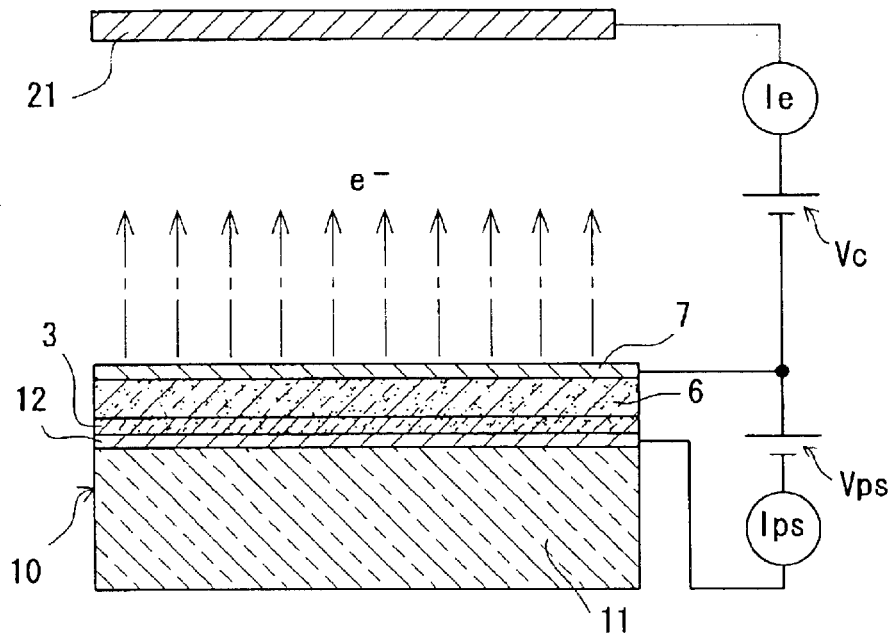
FIG. 21 is an explanatory diagram showing the operation of another conventional electron source.

A tenth mode of embodiment of the present invention will be described below. The electrochemical oxidation apparatus in FIG. 18 is used in the ninth mode of embodiment. In the tenth mode of embodiments an electrochemical oxidation apparatus as shown in FIG. 19 is used to electrochemically oxidize a composite nanocrystal layer 4 of an object 30. The construction and operation of an electron source 10 concerning the tenth mode of embodiment is the same as those of the electron source in the ninth mode of embodiment, and their drawing and description will be omitted. The production process of the electron source 10 concerning the tenth mode of embodiment is fundamentally the same as that in the ninth mode of embodiment, and its description will be omitted.

The electrochemical oxidation apparatus concerning the tenth mode of embodiment includes a lift pump 39 for pumping up an electrolytic solution B in a processing bath. Then, the pumped-up electrolyte solution B is jetted out from a jet flow from a nozzle (not shown) toward the principle surface of the cathode 33 and the semiconductor layer (polycrystalline silicon layer 3, composite nanocrystal layer 4) of the object 30. In the tenth mode of embodiment, the nozzle is moved to jet the electrolytic solution B to the entire surface of the cathode 33 and the entire principal surface of the semiconductor layer of the object 30. As with the ninth mode of embodiment, even if an electrochemical reaction forms air bubbles on the principal surface of the composite nanocrystal layer 4 of the object 30 in a current supply period, the air bubbles will be immediately released therefrom, so as to prevent the air babbles formed on the principal surface of the composite nanocrystal layer 4 from masking the principal surface and suppressing the electrochemical oxidation reaction. Thus, this method can provide reduced in-plane variation in the film thickness or film quality of the silicon oxide films 52, 64 to be formed in the electrochemical-oxidation target region, and the in-plane variation in the withstand voltage performance of the silicon oxide films 52, 64 can be reduced as compared to the conventional method.

Further, this method can prevent increase in the detected voltage from the voltage detect means otherwise caused by the air bubbles formed on the cathode 33, and thus prevent deterioration in the withstand voltage performance of the silicon oxide films 52, 64. This allows the withstand voltage performance of the silicon oxide films 52, 64 to be varied in each of lots. Furthermore, in the tenth mode of embodiment, the electrolytic solution can be jetted out toward the principle surface of the semiconductor layer to release the air babbles from the principle surface of the semiconductor layer. Thus, the air babbles formed on the principle surface of the semiconductor layer can be more reliable released therefrom.

The above technical concept can be applied to a nanocrystallization process using an anodization method.

In either of the embodiments, the electrochemical oxidation apparatus may be used as anodization apparatus only by changing an electrolytic solution and incorporating some elements, such as light source, required for anodization.

While the present invention has been described by reference to specific embodiments, various modifications and alterations will become apparent to those skilled in the art. Therefore, it is intended that the present invention is not limited to the illustrative embodiments herein, but only by the appended claims and their equivalents.

INDUSTRIAL APPLICABILITY

As mentioned above, the electrochemical oxidation method according to the present invention is useful, particularly, in a production process for semiconductor devices such as field-emission-type electron sources, and suitable for use in an oxidation process in semiconductor production.

What is claimed is:

1. A method of performing electrochemical oxidation to a semiconductor layer, wherein an electrode provided on an opposite side of a principal surface to be electrochemically oxidized of said semiconductor layer is used as an anode, and a current is supplied between said anode and a cathode while allowing said semiconductor layer and said cathode to be in contact with an electrolytic solution, to oxidize said semiconductor layer, said method comprising:

supplying a current between said anode and said cathode to initiate said oxidation; and terminating said oxidation under such condition that a corrected voltage value Vt determined by correcting a voltage V between said anode and said cathode in accordance with a voltage inclement V0 based on a pre-detected resistance of said electrolytic solution is equal to a predetermined upper voltage value V1.

2. The method according to claim 1, wherein said oxidation is terminated at a time point when the corrected voltage value Vt has become equal to the upper voltage value V1.

3. The method according to claim 1, wherein said current is constant until the corrected voltage value Vt has become equal to the upper voltage value V1, and is subsequently reduced down to a given value while maintaining the corrected voltage value Vt at the upper voltage value V1, wherein said oxidation is terminated at a time point when said current has been reduced down to said given value, and during the reduction of said current, the corrected voltage value Vt is continuously determined by correcting the voltage V in accordance with the voltage inclement V0.

4. The method according to claim 1, further comprising detecting a resistance of said electrolytic solution using a resistance-measuring electrode before said current is supplied between said anode and said cathode.

5. The method according to claim 1, further comprising detecting a resistance of said electrolytic solution using a resistance-measuring region before said current is supplied between said anode and said cathode, said resistance-measuring region being provided in the principal surface of said semiconductor layer in addition to a given oxidization target region therein.

6. The method according to claim 1, further comprising detecting a resistance of said electrolytic solution using a resistance-monitoring specimen before said current is supplied between said anode and said cathode, said resistance-monitoring specimen having a shape identical to an object to be treated, formed with said semiconductor layer.

7. The method according to claim 1, wherein said electrolytic solution comprises an organic solvent and an electrolyte dissolved in said organic solvent.

8. The method according to claim 1, wherein a current density in the principal surface of said semiconductor layer is controlled in such a manner that the current density in a periphery of an oxidation target region of said semiconductor layer is restrained in increasing to be greater than that in the remaining oxidation target region.

9. The method according to claim 8, wherein the current density is controlled by forming said cathode so as to have a shape which allows a distance between said cathode and said semiconductor layer to be increased in a periphery of said cathode.

10. The method according to claim 8, wherein the current density is controlled by forming said cathode so as to have a shape which allows a specific surface area per unit area in a periphery of said cathode to be less than that in the remaining region of said cathode.

11. The method according to claim 8, wherein the current density is controlled by providing a dummy region capable of reducing the current density in the periphery of the oxidation target region of said semiconductor layer.

12. The method according to claim 8, in which a plurality of said electrodes are arranged in parallel to one another on a surface of said semiconductor layer on the opposite side of the principal surface, each of said electrodes including a current-feeding wiring for feeding said current to said electrodes, wherein the current density is controlled by forming the current-feeding wirings corresponding to the periphery of said oxidation target region so as to have an interval less than that of the current-feeding wirings corresponding to the remaining portion of said oxidation target region.

13. The method according to claim 1, wherein air bubbles formed on the principal surface of said semiconductor layer during the supply of said current, are released from the principal surface while supplying said current.

14. The method according to claim 13, wherein the air bubbles are released by vibrating a substrate having said anode and said semiconductor layer.

15. The method according to claim 13, wherein the air bubbles are released by giving vibration from a vibrator disposed in said electrolytic solution, to said electrolytic solution.

16. The method according to claim 13, wherein the air bubbles are released by directing a jet flow of said electrolytic solution toward the principal surface of said semiconductor layer.

* * * * *